US008623751B2

United States Patent
Nakayama et al.

(10) Patent No.: US 8,623,751 B2
(45) Date of Patent: Jan. 7, 2014

(54) THROUGH-HOLE ELECTRODE SUBSTRATE AND METHOD OF MANUFACTURING THE SAME

(75) Inventors: Koichi Nakayama, Tokyo (JP); Yoichi Hitomi, Tokyo (JP); Takamasa Takano, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 13/466,514

(22) Filed: May 8, 2012

(65) Prior Publication Data

US 2012/0220123 A1 Aug. 30, 2012

Related U.S. Application Data

(62) Division of application No. 12/628,712, filed on Dec. 1, 2009, now Pat. No. 8,198,726.

(30) Foreign Application Priority Data

Dec. 26, 2008 (JP) ................................ 2008-332243
Oct. 7, 2009 (JP) ................................ 2009-233412

(51) Int. Cl.
*H01L 21/02* (2006.01)
(52) U.S. Cl.
USPC ............ 438/596; 257/E21.577; 257/E21.597; 257/E23.011; 257/E25.013
(58) Field of Classification Search
USPC .......... 438/596, 667, 893; 257/E21.577, 597, 257/23.011, 25.013
See application file for complete search history.

(56) References Cited

U.S. PATENT DOCUMENTS

| 6,699,787 | B2 | 3/2004 | Mashino et al. |
| 6,703,310 | B2 | 3/2004 | Mashino et al. |
| 7,576,433 | B2 | 8/2009 | Ishino et al. |
| 8,198,726 | B2 * | 6/2012 | Nakayama et al. ........... 257/734 |
| 2002/0190375 | A1 | 12/2002 | Mashino et al. |
| 2006/0151870 | A1 | 7/2006 | Nishiyama et al. |

(Continued)

FOREIGN PATENT DOCUMENTS

| JP | 54-018653 S | 2/1979 |
| JP | 06-169031 A | 6/1994 |

(Continued)

OTHER PUBLICATIONS

Japanese Office action/Notice of Reasons for Rejection in counterpart application No. JP2010-248721; Jun. 28, 2011.

(Continued)

*Primary Examiner* — Michael Lebentritt
(74) *Attorney, Agent, or Firm* — Pearne & Gordon LLP

(57) ABSTRACT

A through-hole electrode substrate related to an embodiment of the present invention is arranged with a semiconductor substrate having a plurality of through-holes, an insulating layer formed with an insulating material on the inner walls of the plurality of through-holes and on at least one surface of the semiconductor substrate, a plurality of through-hole electrodes formed with a metal material inside the through-hole, and a plurality of gas discharge parts formed to contact with each of the plurality of through-hole electrodes which is exposed on at least one surface of the semiconductor substrate, the plurality of gas discharge parts externally discharges gas which is discharged from the inside of the plurality of through-hole electrodes.

10 Claims, 24 Drawing Sheets

(56) References Cited

U.S. PATENT DOCUMENTS

| | | |
|---|---|---|
| 2006/0234508 A1 | 10/2006 | Shirakashi et al. |
| 2007/0108591 A1 | 5/2007 | Sunohara et al. |
| 2011/0056740 A1 | 3/2011 | Takano |
| 2011/0155450 A1 | 6/2011 | Suzuki et al. |
| 2011/0220406 A1 | 9/2011 | Doi et al. |

FOREIGN PATENT DOCUMENTS

| | | |
|---|---|---|
| JP | 2000-252599 A | 9/2000 |
| JP | 2002-26520 A | 1/2002 |
| JP | 2002-343925 A | 11/2002 |
| JP | 2005-317704 A | 11/2005 |
| JP | 2006-019352 A | 1/2006 |
| JP | 2007-012848 A | 1/2007 |
| JP | 2007-059452 A | 3/2007 |
| JP | 2007-214437 A | 8/2007 |
| JP | 2008-041790 A | 2/2008 |
| WO | 2004-047167 A1 | 6/2004 |

OTHER PUBLICATIONS

Japanese Office action in counterpart application No. 2010-248721; Mar. 15, 2011.
Japanese Office action for application No. 2009-233412 dated Aug. 27, 2013.

* cited by examiner

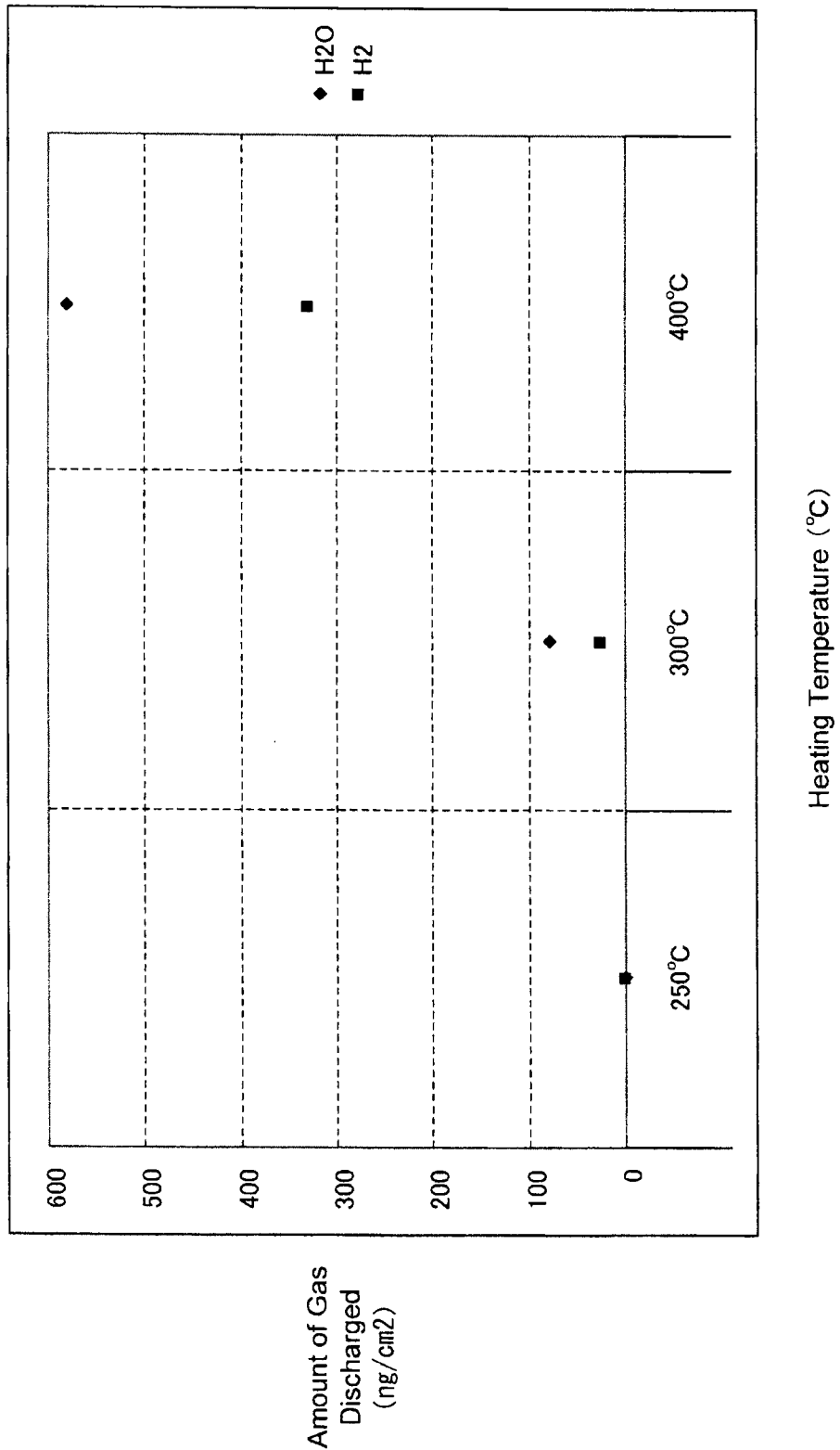

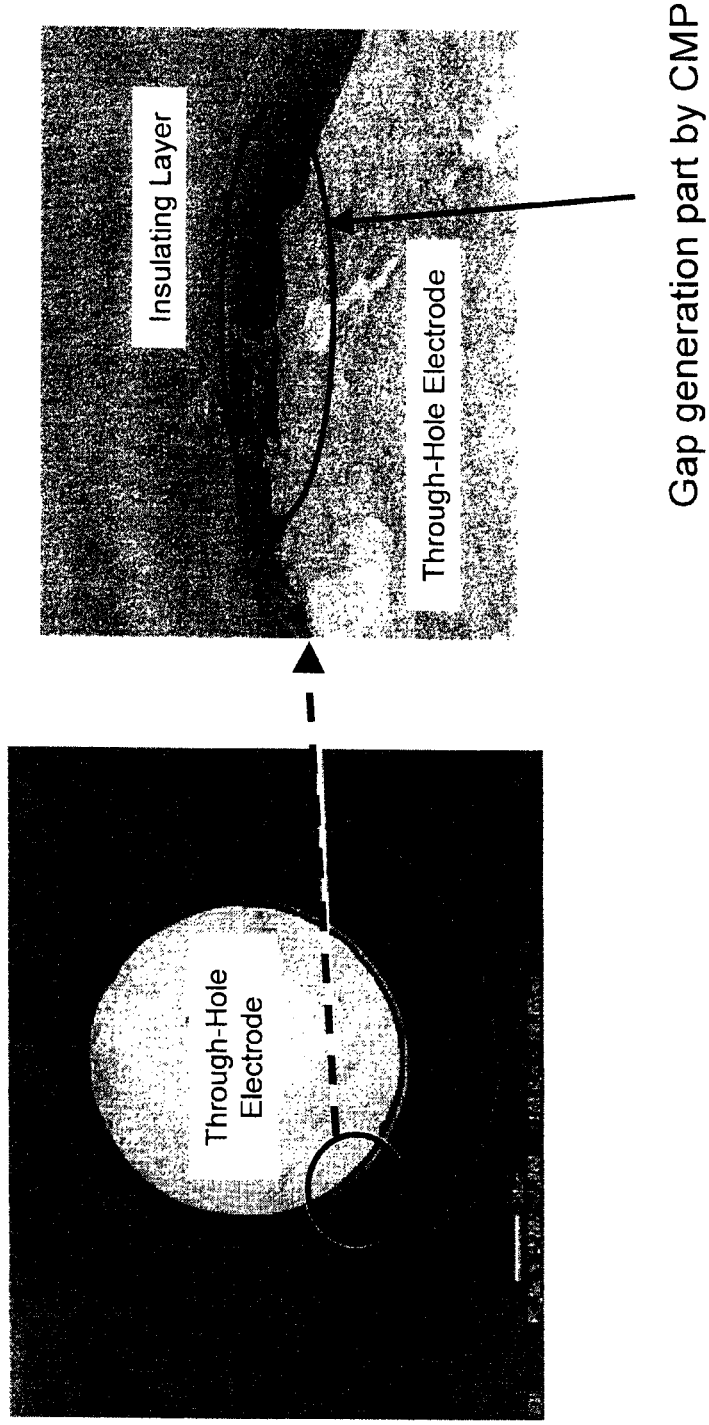

Peeling or swelling doesn't occur at all on the Electrode Pad

200

200

Peeling or swelling doesn't occur at all on the Electrode Pad

Peeling or swelling doesn't occur at all on the Electrode Pad

Electrode pad blow off phenomenon

Electrode pad swelling (peeling) phenomenon

Processes in the first embodiment

Processes in the fourth embodiment

THROUGH-HOLE ELECTRODE SUBSTRATE AND METHOD OF MANUFACTURING THE SAME

CROSS-REFERENCE

This application is a division of U.S. patent application Ser. No. 12/628,712 filed Dec. 1, 2009 now U.S. Pat. No. 8,198,726, which is incorporated herein by reference in its entirety.

BACKGROUND OF THE INVENTION

1. Technical Field

The present invention is related to a through-hole electrode substrate arranged with a through-hole electrode which passes through a front surface and rear surface of a semiconductor substrate, and is also related to a method of manufacturing the through-hole electrode substrate.

2. Field of the Invention

Recently, with the high level of integration of electronic devices and progress in miniaturization, LSI chips are becoming as small as semiconductor packaging. However, high integration via a two dimensional arrangement of chips within a package is reaching its limits. Thus, in order to improve the packaging density of chips within the package it is necessary to divide the LSI chips and stack them in three dimensions. In addition, in order to increase the operation speed of the entire semiconductor package which includes stacked LSI chips, it is necessary to reduce the distance between stacked circuits.

Thus, in order to meet the demands described above, a through-hole electrode substrate arranged with a conducting part which conducts a front surface and rear surface of a substrate is proposed as an interposer between LSI chips. In this type of through-hole electrode substrate, the through-hole electrode is formed by filling the through-hole with a conducting material (Cu for example) using electroplating.

FIG. 18 is a diagram which shows one example of a through-hole electrode substrate 10 which is arranged with a silicon substrate 11, a through-hold 12 which passes through the silicon substrate 11 in the thickness direction of the substrate, an insulating layer 13 comprised of silicon dioxide $SiO_2$ for example, formed on a top and bottom surface from an inner wall of the through-hole 12, a through-hole electrode 14 comprised of copper (Cu), gold (Au) or multilayer plating (Cu/Ni/Au) for example, which is formed within the through-hole 12, and a wiring layer 15 comprised of copper (Cu) for example, arranged on a top and bottom surface of each of these components.

The through-hole electrode substrate 10 shown in FIG. 18 is manufactured by the method described below. First, from one surface of the silicon substrate 11 a hole which does not pass completely through the substrate is formed using a method such as RIE (Reactive Ion Etching), Deep RIE, photo-etching, or wet-etching. Next, from the other surface of the silicon substrate 11, that is, the surface opposite to the one where the hole is first formed, the silicon substrate 11 is set back (thinned) using a method such as grinding and the hole passes completely through the substrate. An insulating layer 13 is formed using a method such as LPCVD (Low Pressure Chemical Vapor Disposition) on the inner surfaces of this through-hole 12 and both surfaces (top and bottom) of the silicon substrate 11. Next, after burying a conducting material comprised from a metal material such as copper (Cu) which becomes the through-hole electrode 14 within the through-hole 12 on which the insulating film 13 is formed, the unnecessary parts of the conducting material which stick out from the through-hole 12 are removed by CMP (Chemical Mechanical Polishing). Then, a wiring layer 15 which becomes the wires and electrode pads is formed by patterning using copper (Cu) for example on the top and bottom surfaces of the silicon substrate 11.

However, in the through-hole electrode substrate 11 manufactured by the manufacturing method described above, a blow off phenomenon of the wiring layer 15 which occurs during an annealing process, or bumps or cracks which occur on the insulating film 13 within the through-hole 12, have been confirmed.

For example, Japan Laid Open Patent 2002-26520 and 2000-252599 propose methods for reducing the blow off phenomenon of the wiring layer and insulating layer bumps or cracks which occur during an annealing process in the manufacturing process of the through-hole electrode substrate described above. In the multilayer wiring substrate disclosed in Japan Laid Open Patent 2002-26520, an opening is arranged on a via island which is arranged directly above a via hole conductor which is filled with a conductive paste, and is formed so that it passes completely through the substrate, and expansion of a gas and water component which are included in the conductive paste is prevented during a heating process. In the print substrate which is disclosed in Japan Laid Open Patent 2000-252599, a hole which connects with the external atmosphere is arranged on a conducting film which covers the surface of a sealing member of a resin which is filled into a through-hole, and a gas which is discharged from the sealing member is discharged to the external atmosphere by heating during reflow.

However, the multilayer wiring substrate and printed circuit board proposed in Japan Laid Open Patent 2002-26520 and 2000-252599 apply to the defects which occur from the gas which is discharged from the through-hole electrode in which the through-hole is filled with a conductive paste or resin, and, as explained below, do not apply to defects which occur from the gas which is discharged from the through-hole electrode in which the through-hole is filled with a metal material forming an insulating layer.

FIG. 19 is a diagram which exemplifies the phenomenon whereby the wiring layer 15 is pushed up and the blow off phenomenon. In this case, a metal material such as copper (Cu) which is filled into the through-hole 12 as a through-hole electrode 14, is stretched, and by discharging the remaining gas (water ($H_2O$) or hydrogen ($H_2$) etc) in the metal material in the annealing process, the wiring layer 15 is pushed up and it is confirmed that the blow off phenomenon occurs. FIG. 21 is a diagram which shows a microscope photograph of a part in which the blow off phenomenon has occurred in one part of a plurality of electrode pads. FIG. 22 is a diagram which shows a microscope photograph of a part in which a swelling phenomenon in one part of the plurality of electrode pads, and mask swelling with regards to the electrode pads occurs.

FIG. 20 is a diagram which exemplifies the phenomenon by which cracks occur in the insulating layer 13. In this case, in the annealing process, when a heating temperature is more than 400° C. for example, bumps and crack occur in the insulating layer 13 due to the difference in the coefficient of thermal expansion between a metal material such as copper (Cu) which is filled as the through-hole electrode 14 and an insulation material such as $SiO_2$ which is used as the insulating layer 13, the metal material enters into the cracks and there is a possibility of short circuits occurring between through-hole electrodes. FIG. 23 is a diagram which shows an SEM photograph of a part in which bumps occur in one part of the insulating layer 13. FIG. 24 is a diagram which shows an SEM photograph of a part in which cracks occur in one part of the insulating layer 13. To prevent this occurring, when performing an annealing process on the through-hole electrode substrate 10 it is necessary to set a low heating temperature. However, the annealing process is necessary and because the gas discharge from within the through-hole electrode 14 described above occurs even at a heating temperature at which cracks are not produced, measures are required.

BRIEF SUMMARY OF THE INVENTION

A through-hole electrode substrate related to one embodiment of the present invention includes a semiconductor substrate having a plurality of through-holes, an insulating layer formed from an insulating material on an inner wall of the plurality of through-holes and on at least one surface of the semiconductor substrate, a plurality of through-hole electrodes formed from a metal material inside the plurality of through-holes which is formed with the insulating layer, and a plurality of gas discharge parts formed to contact with each of the through-hole electrodes which are exposed on at least one surface of the semiconductor substrate, the plurality of gas discharge parts externally discharging gas which is discharged from the inside of the plurality of through-hole electrodes.

A through-hole electrode substrate related to one embodiment of the present invention includes a semiconductor substrate having a plurality of through-holes, an resin layer formed from an insulating resin on an inner wall of the plurality of through-holes and on at least one surface of the semiconductor substrate, and a plurality of through-hole electrodes formed from a metal material inside the plurality of through-holes which is formed with the insulating layer.

A manufacturing method of a through-hole electrode substrate related to one embodiment of the present invention includes forming a plurality of through-holes which pass through a semiconductor substrate in the thickness direction of a semiconductor substrate, forming an insulating layer on the inner walls of the plurality of through-holes and on at least one surface of the semiconductor substrate, and forming a plurality of gas discharge parts which externally discharge gas which is discharged from the inside of the plurality of through-hole electrodes, the plurality of gas discharge parts contacting with each of the plurality of through-hole electrodes which are exposed on at least one surface of the semiconductor substrate.

A manufacturing method of a through-hole electrode substrate related to one embodiment of the present invention includes forming a plurality of holes which have an opening on one surface of a semiconductor substrate, forming a plurality of through-holes by thinning from the other surface on which the plurality of holes of the semiconductor substrate is not formed, and making the plurality of holes pass through the semiconductor substrate, forming an insulating layer on the inner walls of the plurality of through-holes and on at least one surface of the semiconductor substrate, forming a plurality of through-hole electrodes with a metal material inside the plurality of through-holes, and forming a plurality of gas discharge parts which externally discharge gas which is discharged from the inside of the plurality of through-hole electrodes, the plurality of gas discharge parts contacting with each of the plurality of through-hole electrodes which are exposed on at least one surface of the semiconductor substrate.

A manufacturing method of a through-hole electrode substrate related to one embodiment of the present invention includes forming a plurality of through-holes which pass through in the thickness direction of a semiconductor substrate, forming a resin layer with insulating resin on the inner walls of the plurality of through-holes and on at least one surface of the semiconductor substrate, and forming a plurality of through-hole electrodes with a metal material inside the plurality of through-holes.

BRIEF DESCRIPTION OF THE DRAWINGS

FIG. 5 is a diagram which shows one example of a measurement of the relationship between a heating temperature and amount of gas discharged.

FIG. 6 is a diagram which shows an SEM photograph of a gap which occurs at the border section between an insulating layer and a through-hole electrode.

DETAILED DESCRIPTION OF THE INVENTION

First Embodiment

The first embodiment of the present invention will be explained in detail below while referring to the diagrams.

(Structure of a Through-Hole Electrode Substrate)

Figure 1:
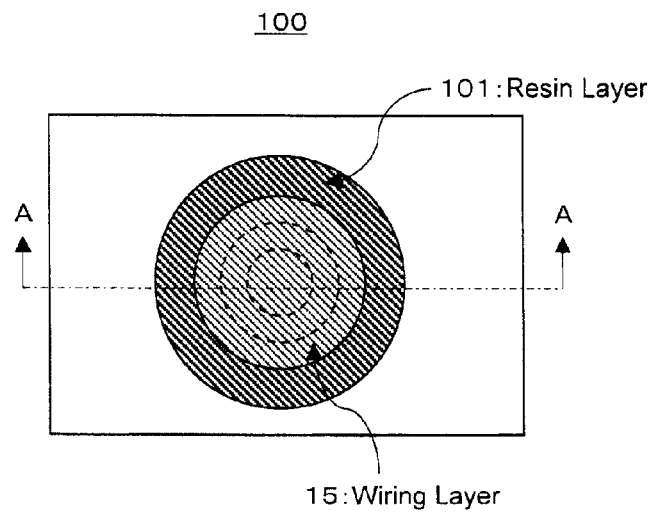
FIG. 1 is a planar diagram which shows the structure of a through-hole electrode substrate related to a first embodiment of the present invention.
Figure 2:
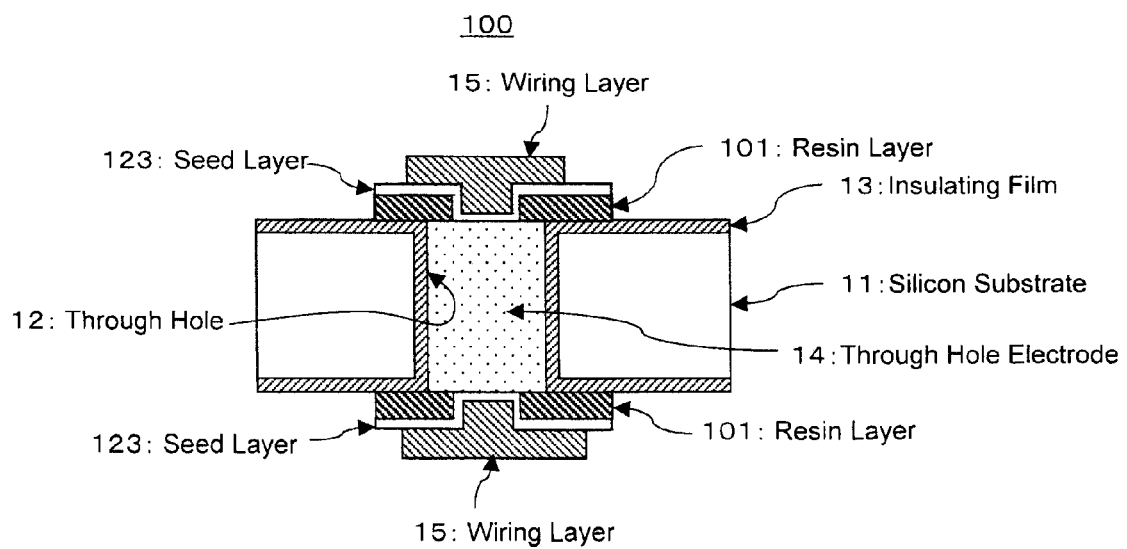
FIG. 2 is a cross-sectional diagram which shows the structure of the through-hole electrode substrate in FIG. 1 viewed from the line A-A.
Figure 18:
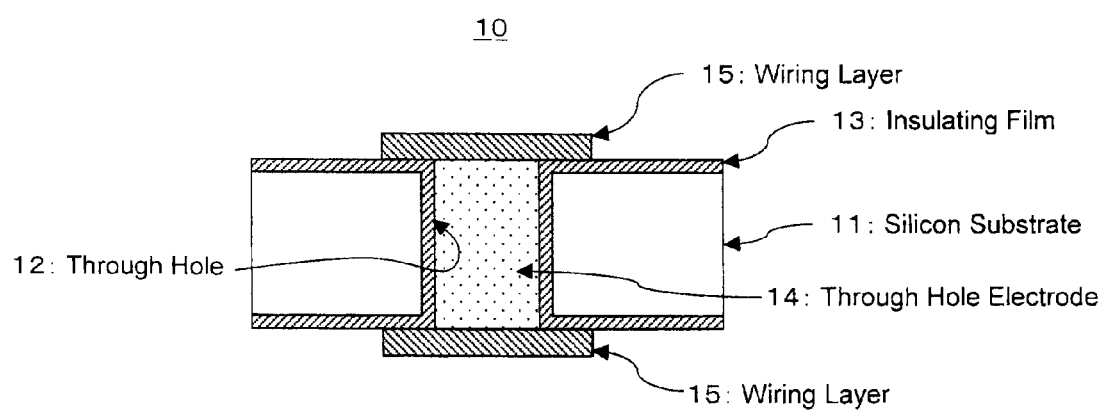
FIG. 18 is a cross-sectional diagram which shows the structure of a conventional through-hole electrode substrate.
Figure 19:
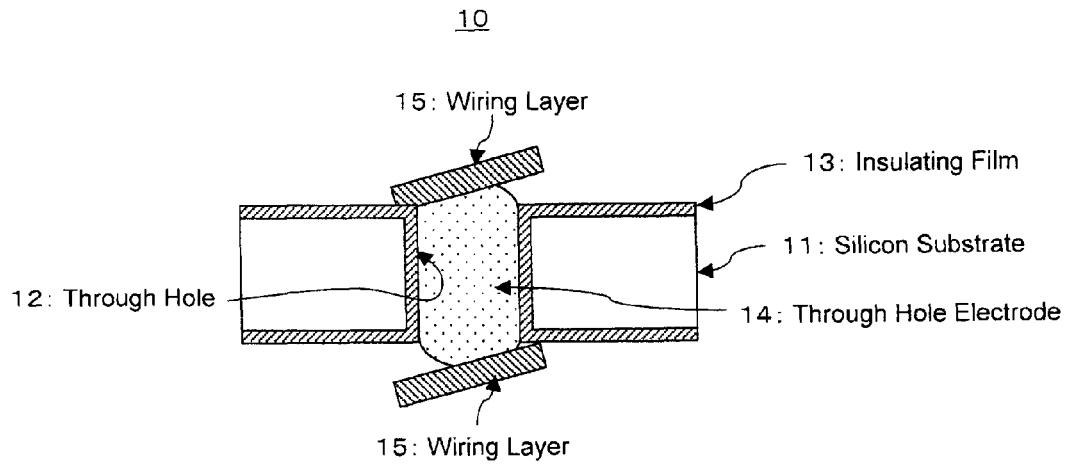
FIG. 19 is an exemplary diagram which shows the phenomenon whereby a wiring layer of the through-hole electrode substrate is pushed up.

The structure of a through-hole electrode substrate 100 related to the first embodiment will be explained while referring to FIG. 1 and FIG. 2. FIG. 1 is planar diagram of the through-hole electrode substrate viewed form the top surface. FIG. 2 is cross-sectional diagram of FIG. 1 viewed from the line A-A. In FIG. 1 and FIG. 2, the same structural elements as in the through-hole electrode substrate 10 shown in FIG. 18 are attached with the same symbols. In the through-hole electrode substrate 100 shown in FIG. 1 and FIG. 2, a resin layer 101 and a wiring layer 15 are formed on the top and bottom surfaces of a silicon substrate 11 on which an insulating layer 13 and a through-hole electrode 14 are formed. The resin layer 101 is formed by a resin material such as polyimide. That is, it is sufficient that the insulating layer has a gas discharge function. This resin layer 101 is arranged in order to externally discharge gas which is discharged from within the through-hole electrode 14. That is, in the first embodiment, the resin layer 101 is arranged as a gas discharge part. In addition, the resin layer 101 may be an inorganic insulating layer such as a silicon oxide film or a silicon nitride film. In this case, the insulating layer is used as a cover after the gas is discharged. In this way, a gas discharge state is maintained.

(Manufacturing Method of the Through-Hole Electrode Substrate)

Next, the processes for manufacturing the through-hole electrode substrate 100 will be explained while referring to FIG. 3 and FIG. 4. FIGS. 3A to E are diagrams which show the processes for forming a through-hole electrode in the silicon substrate 11. Furthermore, FIGS. 3A to E only show one through-hole electrode 14 formed in the silicon substrate 11 for the purposes of simplifying explanation. In the actual silicon substrate 11, a plurality of through-hole electrodes with a desired hole diameter (for example, 10 μm to 100 μm) are formed at desired intervals according to specifications.

(1) Forming Process of a Through-Hole

Figure 3A:
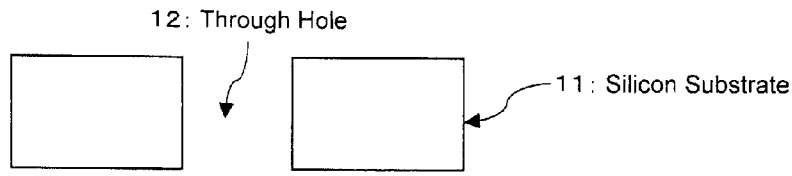
FIG. 3A is a diagram which shows a forming process of a through-hole of the through-hole electrode substrate.

First, in FIG. 3A, the silicon substrate 11 is etched and a hole (not shown in the diagram) which does not pass all the way through the substrate, is formed on one surface of the silicon substrate 11 using a method such as RIE, Deep RIE, photo-etching or wet-etching. Next, on the other surface of the silicon substrate 11, that is, the surface opposite to the one where the hole is first formed, the silicon substrate 11 is set back (thinned) using a method such as grinding, and the hole 12 passes completely through the substrate. Furthermore, the formation method of the through-hole 12 is not limited to this formation method. For example, the through-hole may be formed by using RIE, Deep RIE, photo-etching or wet-etching from one surface of the silicon substrate 11.

(2) Forming Process of an Insulating Layer

Figure 3B:
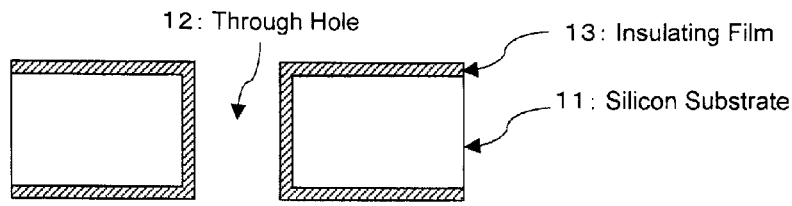
FIG. 3B is a diagram which shows a forming process of an insulating layer of the through-hole electrode substrate.

Next, in FIG. 3B, an insulating layer 13 is formed on the inner surface of this through-hole 12 and both surfaces (upper and lower) of the silicon substrate 11. The insulating layer 13 is comprised of an inorganic insulation layer of, for example, silicon oxide ($SiO_2$), silicon nitride (SiN) or silicon carbide (SiC). This insulating layer 13 is formed using a method such as LPCVD (Low Pressure Chemical Vapor Disposition) method, PECVD (Plasma Enhanced Chemical Vapor Deposition) method or sputtering method. In the case where the insulating layer 13 is formed from silicon oxide ($SiO_2$), it is possible to form the insulating layer by a thermal oxidation method or anodic oxidation method. The insulating layer 13 may be formed as a single layer or have a stacked structure of two or more layers.

(3) Forming Process of a Seed Layer

Figure 3C:
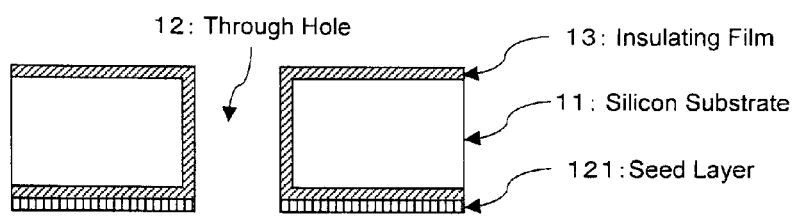
FIG. 3C is a diagram which shows a forming process of seed layer of the through-hole electrode substrate.

Next, in FIG. 3C, a seed layer 121 is formed on the bottom surface of the silicon substrate 11 which is formed with the insulating layer 13, using a sputtering method for example. The seed layer 121 may be formed one layer using titanium (Ti) or two layers using titanium (Ti) and copper (Cu). In the case where the seed layer 121 is formed with two layers, it is preferred that the copper layer (Cu) may be formed as a layer which contacts with the through-hole electrode 14.

(4) Forming Process of a Conducting Part

Figure 3D:
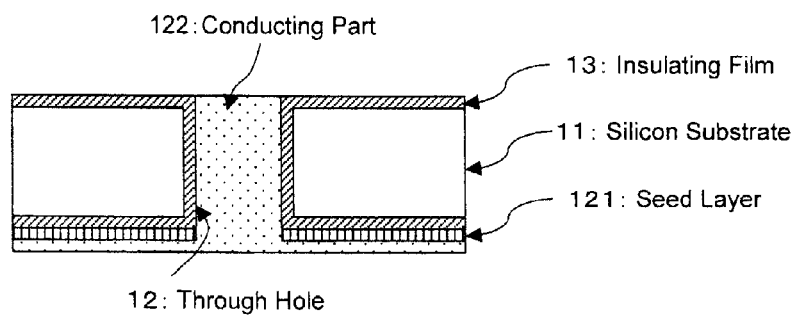
FIG. 3D is a diagram which shows a forming process of a conducting part of the through-hole electrode substrate.

Next, in FIG. 3D, a conducting material (such as copper (Cu) or a copper alloy) is filled into the through-hole 12 by electroplating, the seed layer 121 of the silicon substrate 11 becomes a power supply layer and a conducting part 122 is formed. In this case, as is shown in FIG. 3D, the conducting part 122 is also formed on the surface on which the seed layer 121 is formed. A sputtering method, nonelectrolytic plating method, molten metal suction method, print method or CVD method can be used to fill the copper (Cu) or copper alloy.

(5) Forming Process of a Through-Hole Electrode

Figure 3E:
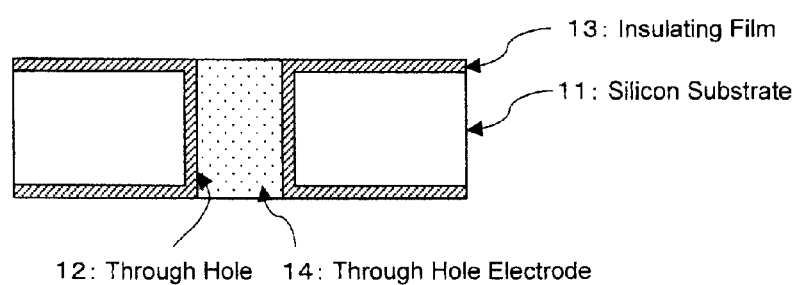
FIG. 3E is a cross-sectional diagram of a completed through-hole of the through-hole electrode substrate.

Next, in FIG. 3E, the surface on which the seed layer 121 and the conducting part 122 are formed on the silicon substrate 11 is etched using such as a CMP method, the unnecessary conducting part 122 and one part of the seed layer 121 are removed and the forming process of the through-hole electrode 14 is complete.

(6) Forming Process of a Resin Layer

Figure 4A:
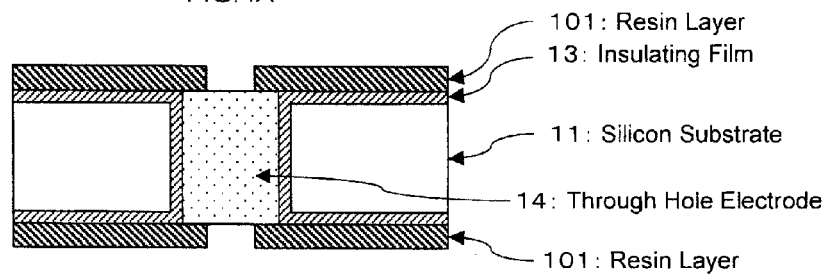
FIG. 4A is a diagram which shows a forming process of a resin layer of the through-hole electrode substrate.

Next, in FIG. 4, an insulating resin such as photosensitive polyimide is patterned on the periphery of the through-hole electrode 14 as is shown in FIG. 1 and FIG. 2, on the top and bottom surfaces of the silicon substrate 11 on which the through-hole electrode 14 is formed using photolithography, heat curing is performed (200° C. or more) and the resin layer 101 is formed. In this case, it is important that the resin layer 101 is formed so that a part of the border section between the forming part of the insulating layer 13 and the forming part of the through-hole electrode 14 is covered. That is, in the above described annealing process (heat curing), after removing a plating resist 123 by a chemical process which uses an organic solvent, it was discovered that the gas which is discharged from the through-hole electrode 14 is discharged from a slight gap which is formed on the border section between the insulating layer 13 and the through-hole electrode 14. This point will be described below. Furthermore, the resin layer 10 may be formed by an inorganic insulation material such as an oxide film or nitride film, in other words, an insulating layer having a gas discharge function. Furthermore, non-photosensitive polyimide may be used as the resin layer 101.

(7) Forming Process of a Plating Resist

Figure 4B:
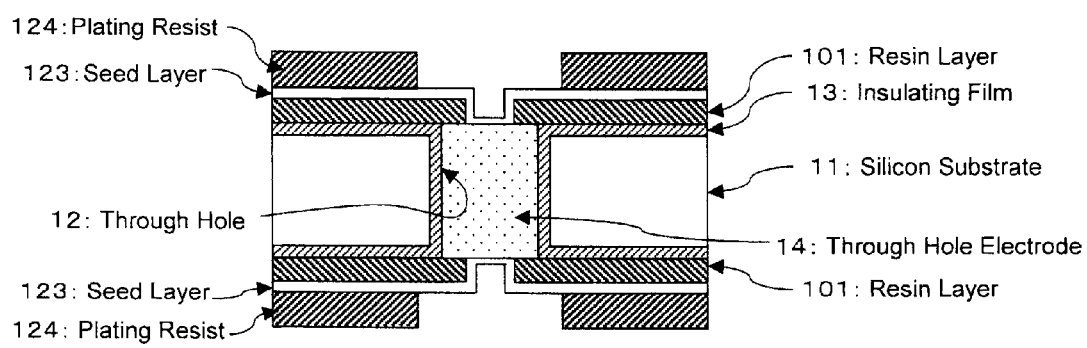
FIG. 4B is a diagram which shows a forming process of a seed layer and plating resist of the through-hole electrode substrate.

Next, in FIG. 4B, a seed layer 123 is formed on the surface on which the resin layer 101 is formed using a sputtering method. Then, a plating resist 124 is formed above the seed layer 123 using photolithography. Furthermore, the seed layer 123 may be formed as one layer using a seed material such as titanium Ti or may be formed in two layers using titanium (Ti) and copper (Cu).

(8) Forming Process of a Wiring Layer

Figure 4C:
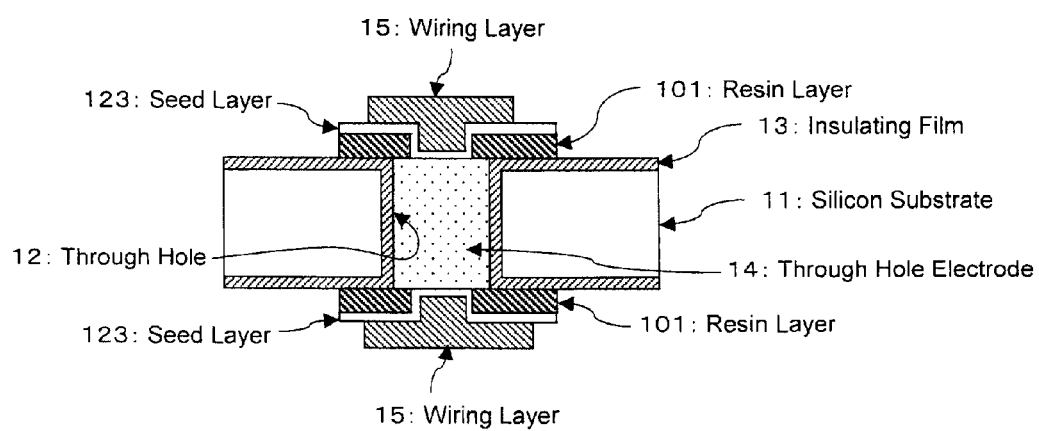
FIG. 4C is a cross-sectional diagram of a completed through-hole electrode substrate.

Next, in FIG. 4C, a wiring layer 15 which becomes the wires and electrode pads is formed as a power supply layer by the seed layer 123 by electrolyte plating. The wiring layer 15 may be formed using copper (Cu), gold (Au), multilayer plating (Cu, Ni, Au) or a copper alloy. Next, the plating resist 124 is removed by a chemical process and the seed layer is removed by chemical etching from the surface on which the wiring layer 15 of the silicon substrate 11 is formed. Then the forming process of the through-hole electrode substrate 100 is complete. Furthermore, FIG. 4C shows that the exterior periphery of the resin layer 101 is removed, however, it is not necessary to remove the exterior periphery of the resin layer 101. That is, it is important to demonstrate the gas discharge function by contacting the inner periphery of the resin layer 101 with the through-hole electrode 14, and the shape of the exterior periphery of the resin layer 101 is not limited.

In FIG. 3 and FIG. 4, the case where the resin layer 101 and the wiring layer 15 are formed on the top and bottom surfaces of the silicon substrate 11 is shown. However, the resin layer 101 and the wiring layer 15 may be formed on either the top surface or the bottom surface of the silicon substrate 11 by the above described process.

(Gas Discharge from the Through-Hole Electrode)

Figure 20:
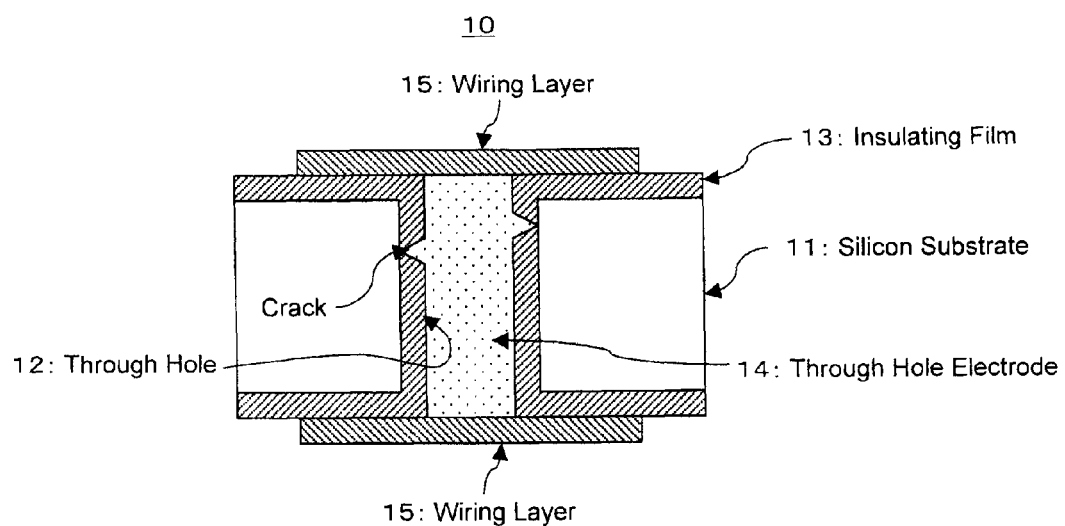
FIG. 20 is an exemplary diagram which shows the phenomenon whereby cracks occur within the through-hole electrode substrate.
Figure 23:
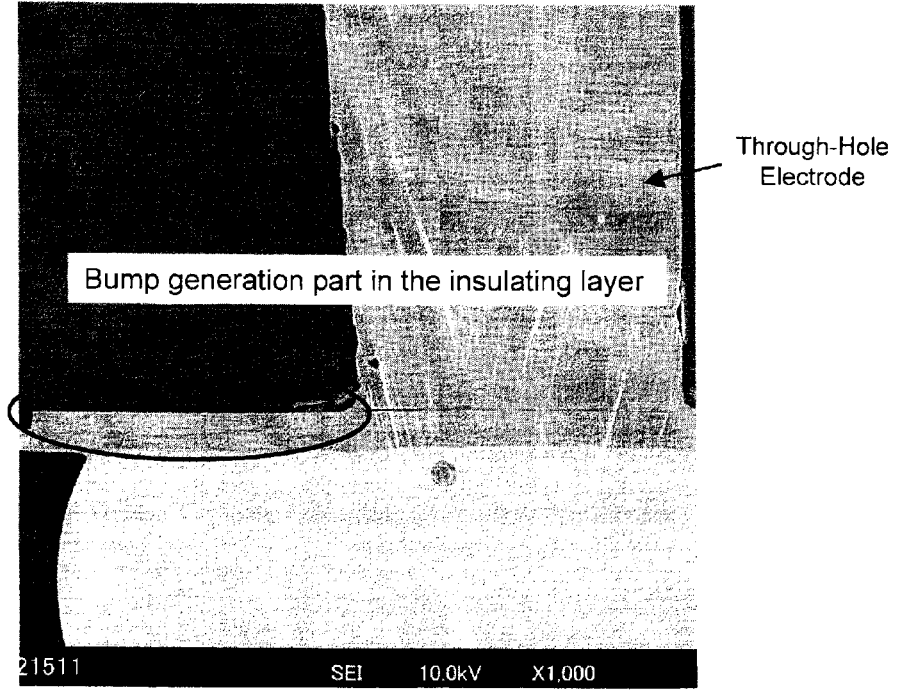
FIG. 23 is a diagram which shows an SEM photograph of a part in which bumps occur in one part of an insulating layer.
Figure 24:
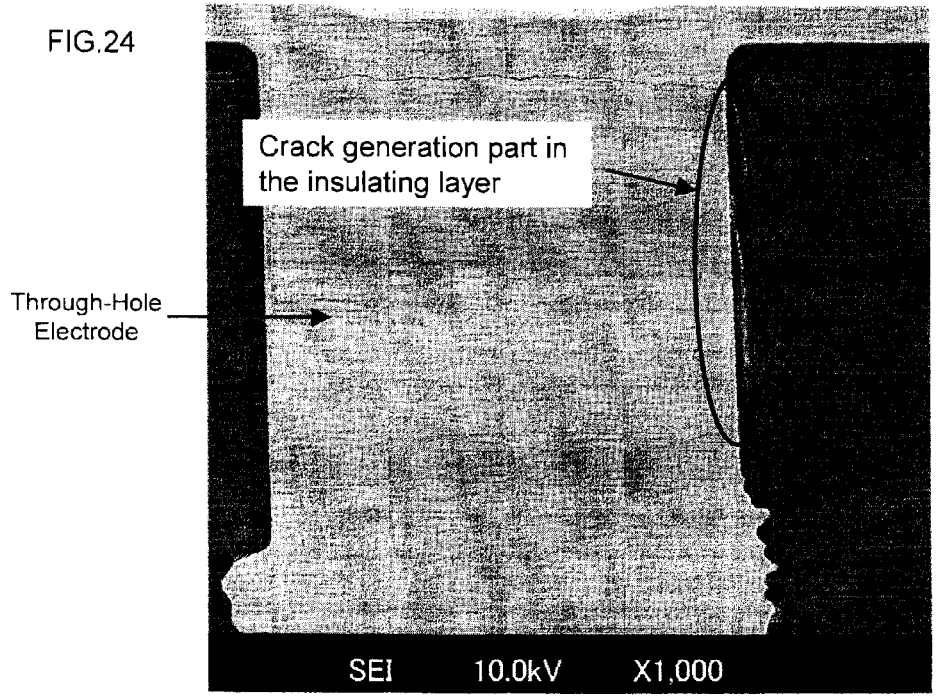
FIG. 24 is a diagram which shows an SEM photograph of a part in which cracks occur in one part of an insulating layer.

In the through-hole electrode substrate 100 formed by the manufacturing method described above, it was confirmed that a metal material such as copper (Cu) which was filled as the through-hole electrode 14 and gas such as water ($H_2O$) or hydrogen ($H_2$) which remains in the silicon substrate 11 were discharged by the annealing process. FIG. 5 is a diagram which shows the results of a measurement of each discharged amount (ng/cm$^2$) of water ($H_2O$) and hydrogen ($H_2$) which is discharged from the through-hole electrode after increasing the heating temperature. In FIG. 5, it was discovered that the discharge amount of water ($H_2O$) (The diamond plot in the diagram) and hydrogen ($H_2$) (the square plot in the diagram) increased at each heating temperature, 250° C., 300° C. and 400° C. Furthermore, in the case where the heating temperature is 250° C., water ($H_2O$) and hydrogen ($H_2$) are almost not discharged at all, and as shown in FIG. 20 and FIG. 23, it was confirmed that stretching occurred in the copper (Cu) which is filled as the through-hole electrode 14 and swelling (peeling) occurred in the electrode pad. In addition, in the case where the heating temperature is 300° C. and 400° C., the amount of water ($H_2O$) and hydrogen ($H_2$) that is discharged increases.

The reason for the increase in the amount of water ($H_2O$) and hydrogen ($H_2$) discharged is the slight gap that occurs on the border section between the insulating layer 13 and the through-hole electrode 14 after removing the plating resist 124 by a chemical process and after removing the seed layer 123 by etching. An example of the occurrence of this gap is shown in FIG. 6. FIG. 6 is a photograph taken by a SEM of the border section between the insulating layer 13 and the through-hole electrode 14 after the plating resist is removed by a chemical process and after the seed layer 124 is removed by chemical etching. FIG. 6A shows this section by "O" and FIG. 6B is an enlarged photograph of this section. As is shown in FIG. 6B, after the plating resist is removed by a chemical process and after the seed layer 124 is removed by chemical etching, it was confirmed that a slight gap is produced on the border section between the insulating layer 13 and the through-hole electrode 14. It was confirmed that the gas (water ($H_2O$) and hydrogen ($H_2$)) which is discharged from the inside of the through-hole electrode 14 builds up in the gap which is produced on this border section, the wiring layer 15 is pushed up and blow off occurs.

(Gas Discharge Effects by a Resin Layer)

Figure 7:
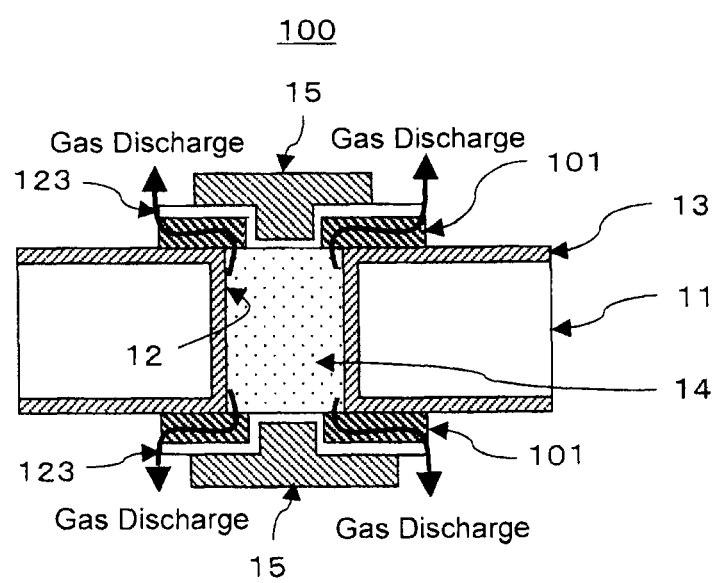
FIG. 7 is a diagram which exemplary shows gas discharge from a resin layer of the through-hole electrode substrate related to the first embodiment.

In the through-hole electrode substrate 100 related to the first embodiment, the resin layer 101 is formed so that the border section between a part of the insulating layer 13 which is exposed on a surface of the silicon substrate 11 and a part of the through-hole electrode 14 is covered (so that the through-hole electrode 14 covers a smaller area than the area which is exposed on the surface of the silicon substrate 11). In addition, in the resin layer 101 because the molecular structure from the molecules of the gas (water ($H_2O$), hydrogen ($H_2$)) which is discharged from inside of the through-hole electrode 14 is large it is possible to externally discharge this gas. That is, as is shown in FIG. 7, in the annealing process, the gas (water ($H_2O$), hydrogen ($H_2$)) which is discharged from within the through-hole electrode 14 is externally discharged via the resin layer 101. Furthermore, the area in which the resin layer 101 contacts with the through-hole electrode 14 which is exposed on the surface of the silicon substrate 11 is sufficient to be around 20-80% for example of the entire exposed area of the through-hole electrode 14. In addition, the thickness of the resin layer 101 may be about 1-20 μm and more preferably about 3-8 μm. Each value of the contact area and thickness of the resin layer 101 are not particularly limited and may be any value which demonstrates the above described gas discharge effects.

Figure 8:
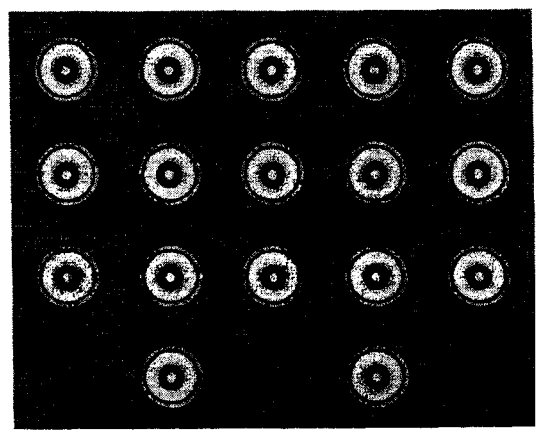
FIG. 8 is a diagram which shows a photograph of the surface of the through-hole electrode substrate which shows an example where peeling does not occur on the electrode pad.
Figure 9:
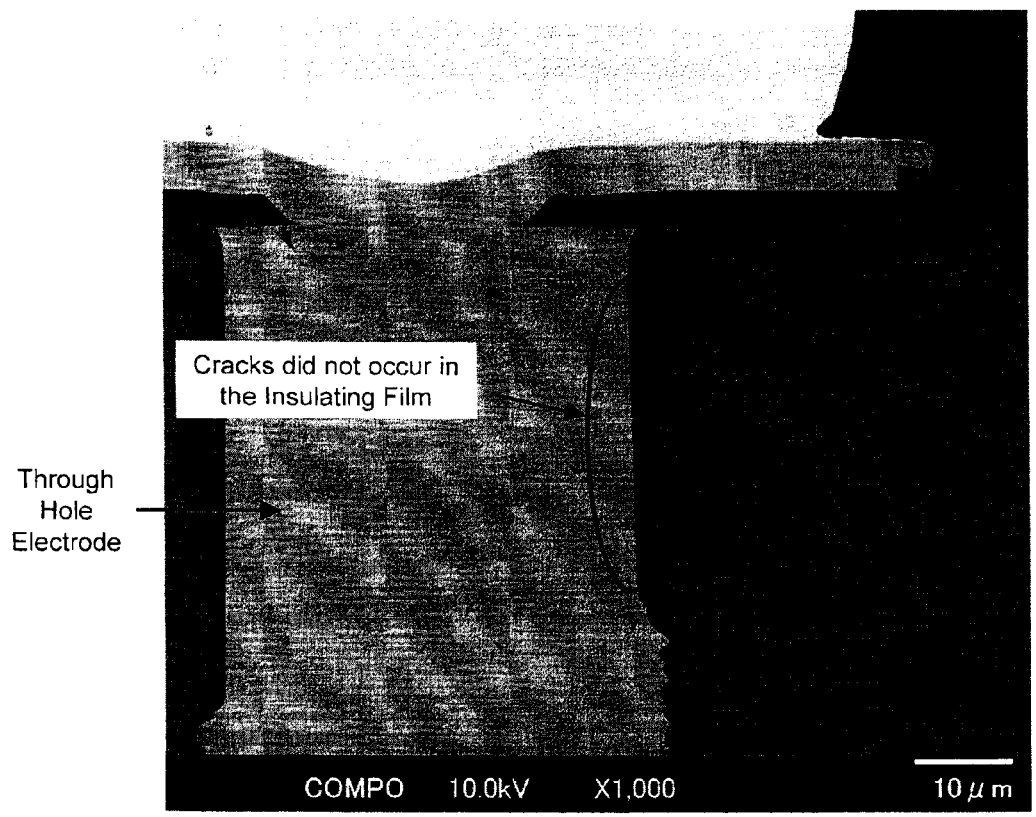
FIG. 9 is a diagram which shows an SEM photograph of the surface of the through-hole electrode substrate which shows an example where cracks do not occur within the through-hole electrode.
Figure 21:
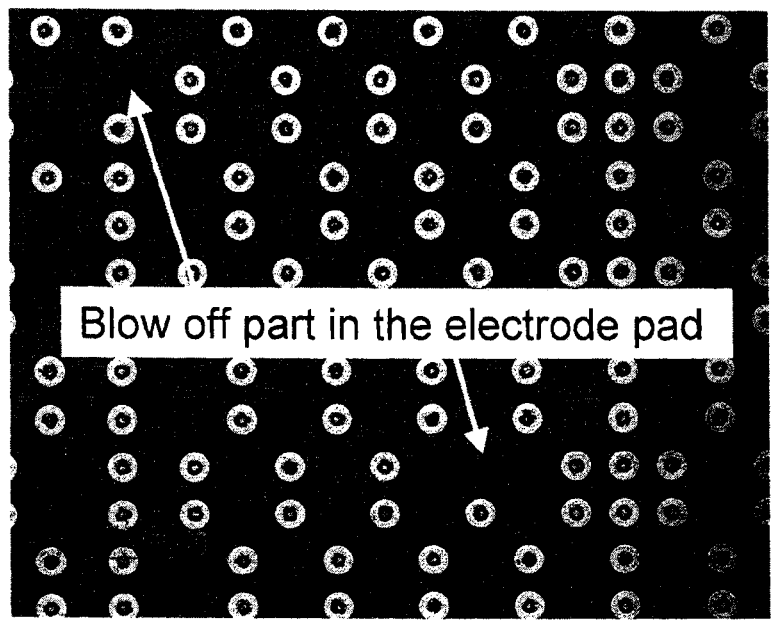
FIG. 21 is a photo which shows one example of the blow off phenomenon of the electrode pad.
Figure 22:
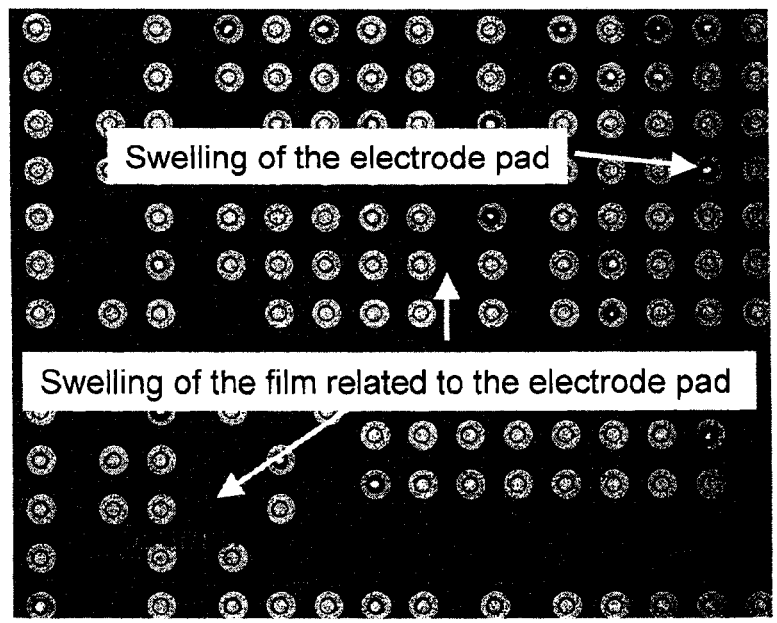
FIG. 22 is a photo which shows one example of swelling (peeling) of the electrode pad.

As a result, it is possible to prevent the occurrence of the blow off and swelling (peeling) phenomenon of the electrode pad as shown in FIG. 21 and FIG. 22. A microscope photograph taken of the substrate surface after adding the resin layer 101 to the through-hole electrode substrate 100 and performing annealing is shown in FIG. 8. As is shown in FIG. 8, peeling or swelling doesn't occur at all on the electrode pad. In addition, as is shown in FIG. 9, it was confirmed that cracks did not occur in the insulating layer 13.

As a result of this, in the case where the resin layer 101 is added to the through-hole electrode substrate 100, in addition to the effect of externally discharging gas from the inside of the through-hole electrode 14, it was discovered that stretching of copper (Cu) which is filled as the through-hole electrode 14 was reduced (elasticity effect).

As described above, in the through-hole electrode substrate 100 shown in the first embodiment, it is possible to externally discharge the gas discharged from within the through-hole electrode 14 which is formed by filling a metal such as copper (Cu) into the through-hole 12 which is formed in the silicon substrate 11, by arranging the resin layer 101. In addition, it was also discovered that this resin layer 101 had the effect (elasticity effect) of reducing stretching of the filled copper (Cu). As a result, it is possible to prevent the occurrence of the blow off, swelling (peeling) of the electrode pad and cracks, reduce the yield at the time of manufacturing the through-hole electrode substrate 100 and improve reliability.

Second Embodiment

The second embodiment of the present invention will be explained in detail below while referring to the diagrams.
(Structure of a Through-Hole Electrode Substrate)

Figure 10:
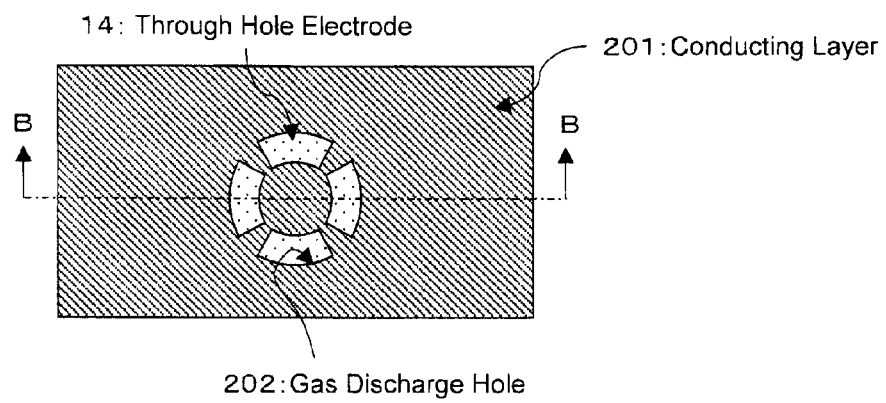
FIG. 10 is a planar diagram which shows the structure of a through-hole electrode substrate related to a second embodiment of the present invention.
Figure 11:
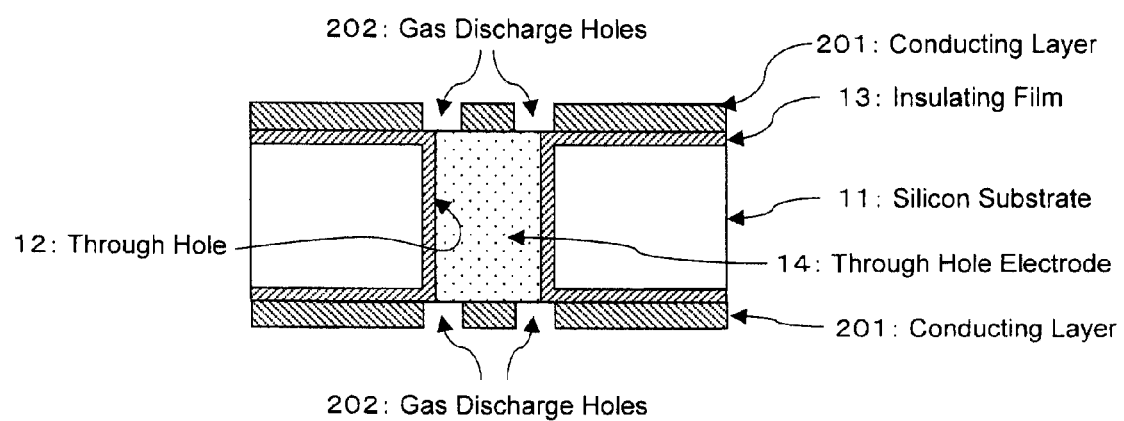
FIG. 11 is a cross sectional diagram which shows the structure of the through-hole electrode substrate in FIG. 10 viewed from the line B-B.

The structure of a through-hole electrode substrate 200 related to the second embodiment will be explained in detail while referring to FIG. 10 and FIG. 11. FIG. 10 is a planar diagram of the through-hole electrode substrate 200 viewed from the top surface. FIG. 11 is a cross sectional diagram of FIG. 10 viewed from the line B-B. In FIG. 10 and FIG. 11, the same structural elements as in the through-hole electrode substrate 10 shown in FIG. 18 are attached with the same symbols. In the through-hole electrode substrate 200 shown in FIG. 10 and FIG. 11, a conducting layer 201 and a plurality of gas discharge holes 202 are formed on the surface of the silicon substrate 11 on which the insulating layer 13 and through-hole electrode 14 are formed. The gas discharge holes 202 are formed so that one part of the border section between the insulating layer 13 which is exposed on the surface of the silicon substrate 11, and the through-hole electrode 14, is exposed. Furthermore, the gas discharge holes 202 are not limited to the shape or number shown in FIG. 10. Anything can be used as long as the border section between the insulating layer 13 which is exposed on the surface of the silicon substrate 11, and the through-hole electrode 14, is exposed. That is, in the second embodiment, the gas discharge holes 202 are arranged as gas discharge parts.
(Manufacturing Method of the Through-Hole Electrode Substrate)

Figure 12A:
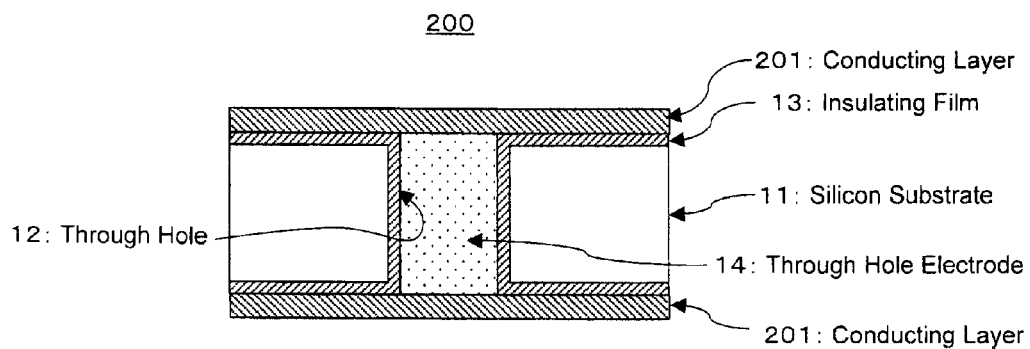
FIG. 12A is a diagram which shows a forming process of a conducting layer of the through-hole electrode substrate.
Figure 12B:
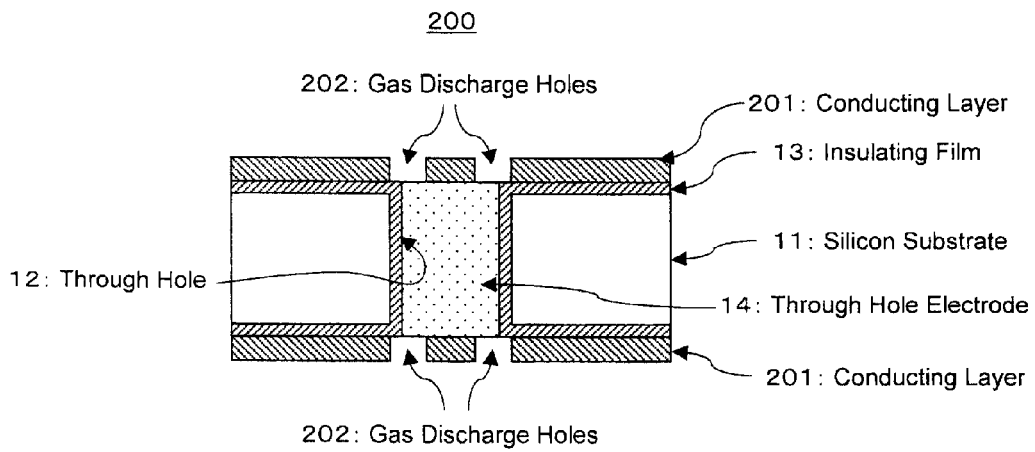
FIG. 12B is a cross-sectional diagram of a completed through-hole electrode substrate.

Next, the processes for manufacturing the through-hole electrode substrate 200 are explained while referring to FIG. 12. FIGS. 12A and 12B are diagrams which show the sequence of processes for forming a conducting layer 201 and plurality of gas discharge holes 202 on the silicon substrate 11 in which the insulating layer 13 and through-hole electrode 14 are formed. Furthermore, only one through-hole electrode 14 is shown formed on the silicon substrate 11 in FIGS. 12A and 12B in order to simplify explanation. In an actual silicon substrate 11, a plurality of through-hole electrodes having a desired hole diameter (for example, 10 μm-100 μm) are formed at desired intervals according to specifications. Furthermore, because the processes for forming the insulating layer 13 and through-hole electrode 14 on the silicon substrate 11 are the same as the processes explained in FIG. 3A to 3E in the first embodiment, an explanation of those processes is omitted here.
(1) Forming Process of a Conducting Layer In FIG. 12A, a conducting layer 201 which becomes the wires and electrode pads, is formed on the entire top and bottom surface of the silicon substrate 11 in which the insulating layer 13 and the through-hole electrode 14 are formed using such as copper (Cu), Gold (Au), multilayer plating (Cu, Ni, Au) or a copper alloy.
(2) Forming Process of a Gas Discharge Hole Next, in FIG. 12B, a plurality of gas discharge holes 202 are formed in the conducting layer 201 so that the border section between one part of the insulating layer 13 and one part of the through-hole electrode 14 is exposed.
(Gas Discharge Effect Via the Gas Discharge Hole)

In the through-hole electrode 200 related to the second embodiment, a plurality of the gas discharge holes 202 are formed so that one part of the border section between the insulating layer 13 which is exposed on the surface of the silicon substrate 11, and the through-hole electrode 14, is exposed (so that the through-hole electrode 14 is exposed by an area smaller than the area exposed on the surface of the silicon substrate 11). It is possible for these gas discharge holes 202 to externally discharge gas (water ($H_2O$), hydrogen ($H_2$)) which is discharged from the inside of the through-hole electrode 14. That's is, as is shown in FIG. 7, in the annealing process, the gas (water ($H_2O$), hydrogen ($H_2$)) which is discharged from inside the through-hole electrode 14 is externally discharged from the gas discharge holes 202.

Figure 13:
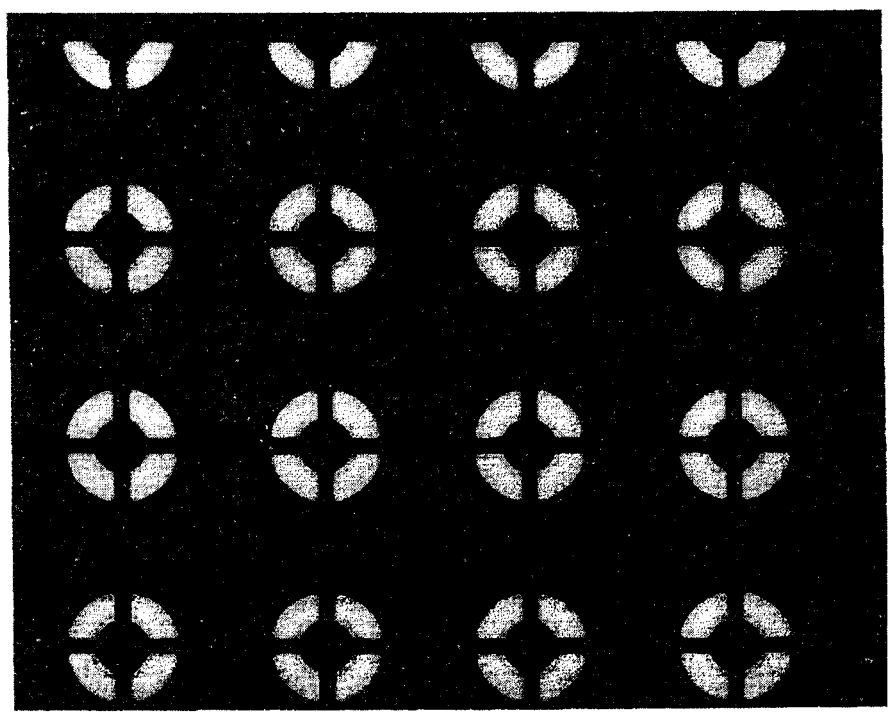
FIG. 13 is a diagram which shows a photograph of the surface of a through-hole electrode substrate which shows an example where peeling or swelling does not occur on the electrode pad.

As a result, it is possible to prevent the occurrence of the blow off and swelling (peeling) phenomenon of the electrode pad as shown in FIG. 21 and FIG. 22. A microscope photograph taken of the substrate surface after forming the gas discharge hole 202 on the through-hole electrode substrate 200 and performing annealing is shown in FIG. 13. As is shown in FIG. 13, peeling or swelling doesn't occur at all on the electrode pad.

As described above, in the through-hole electrode substrate 200 shown in the second embodiment, it is possible to externally discharge the gas discharged from within the through-hole electrode 14 which is formed by filling a metal such as copper (Cu) into the through-hole 12 which is formed in the silicon substrate 11, by arranging the gas discharge hole 202. As a result, it is possible to prevent the occurrence of the blow off, swelling (peeling) of the electrode pad and cracks, reduce the yield at the time of manufacturing the through-hole electrode substrate 200 and improve reliability.

Third Embodiment

The third embodiment of the present invention will be explained in detail below while referring to the diagrams.
(Structure of a Through-Hole Electrode Substrate)

Figure 14:
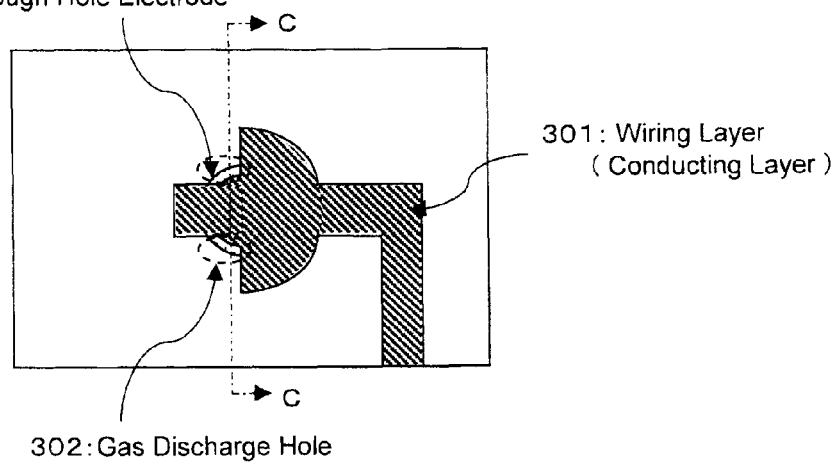
FIG. 14 is a planar diagram which shows the structure of a through-hole electrode substrate related to a third embodiment of the present invention.
Figure 15:
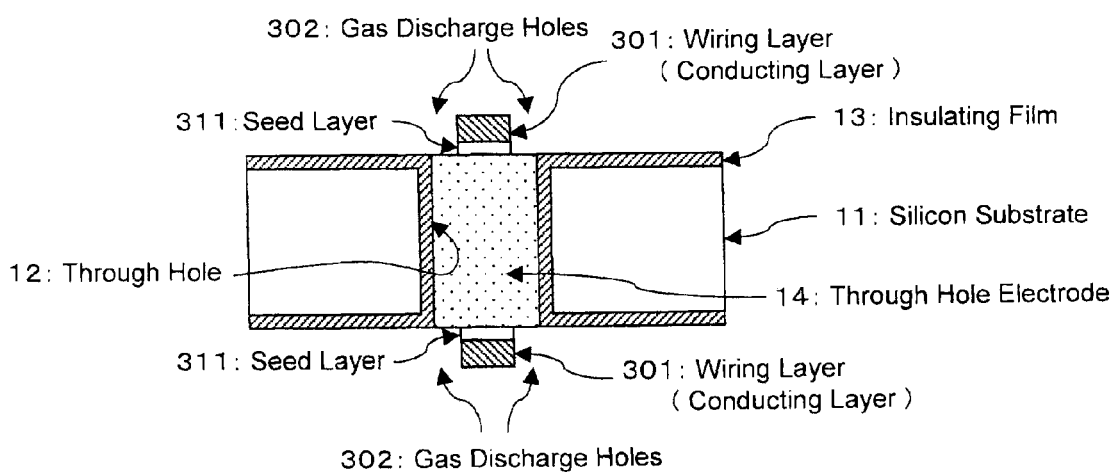
FIG. 15 is a cross-sectional diagram which shows the structure of the through-hole electrode substrate in FIG. 14 viewed from the line C-C.

The structure of a through-hole electrode substrate 300 related to the third embodiment will be explained in detail while referring to FIG. 14 and FIG. 15. FIG. 14 is a planar diagram of the through-hole electrode substrate 300 viewed from the top surface. FIG. 15 is a cross sectional diagram of FIG. 14 viewed from the line C-C. In FIG. 14 and FIG. 15, the same structural elements as in the through-hole electrode substrate 10 shown in FIG. 18 are attached with the same symbols. In the through-hole electrode substrate 300 shown in FIG. 14 and FIG. 15, a wiring layer (conducting layer) 301 and a plurality of gas discharge holes 302 are formed on the surface of the silicon substrate 11 on which the insulating layer 13 and through-hole electrode 14 are formed. The gas discharge holes 302 are formed so that one part of the border section between the insulating layer 13 which is exposed on the surface of the silicon substrate 11, and the through-hole electrode 14, is exposed. Furthermore, the gas discharge holes 302 are not limited to the shape or number shown in FIG. 15. Anything can be used as long as the border section between the insulating layer 13 which is exposed on the surface of the silicon substrate 11, and the through-hole electrode 14, is exposed. That is, in the third embodiment, the gas discharge holes 302 are arranged as gas discharge parts.
(Manufacturing Method of the Through-Hole Electrode Substrate)

Figure 16A:
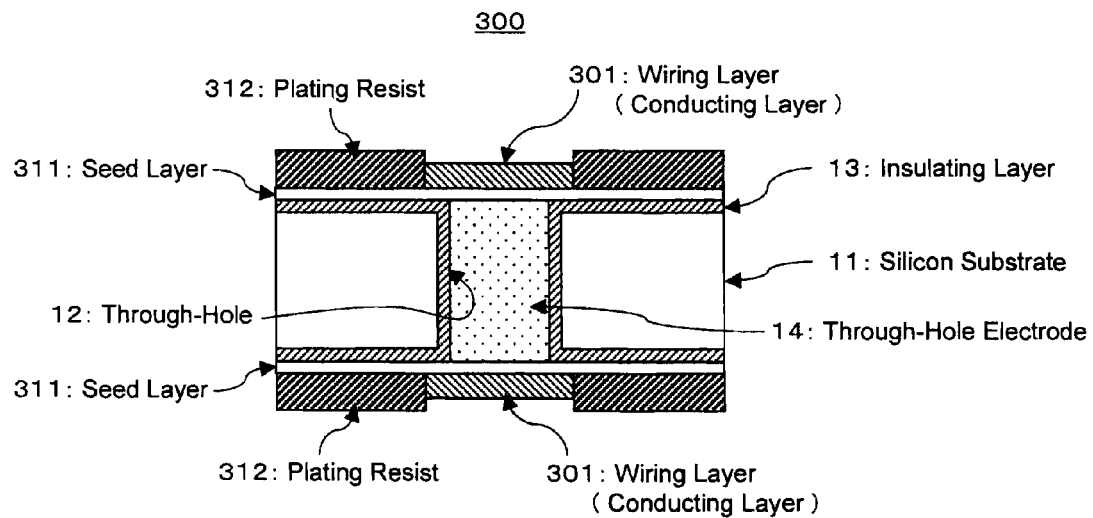
FIG. 16A is a diagram which shows a forming process of a seed layer, plating resist and conducting layer of the through-hole electrode substrate.
Figure 16B:
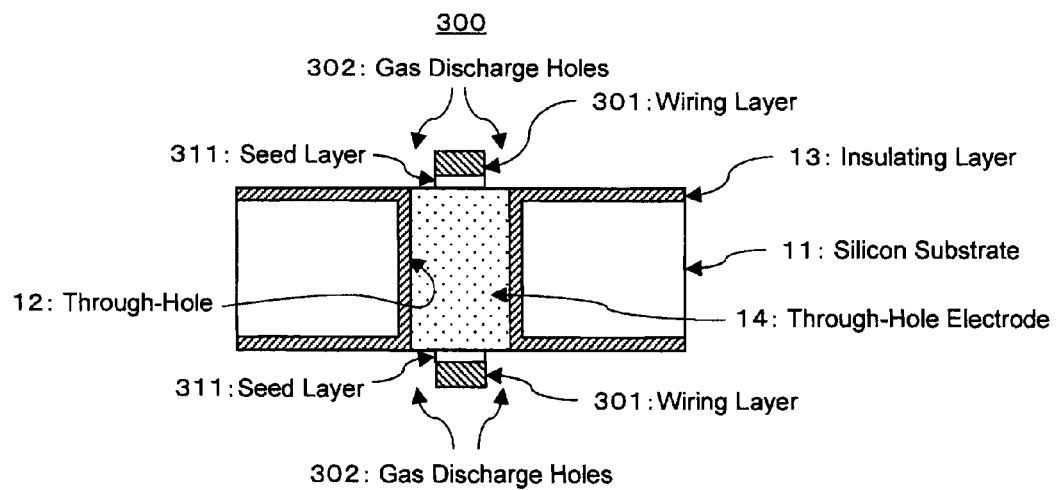
FIG. 16B is a cross-sectional diagram of a completed through-hole electrode substrate.

Next, the processes for manufacturing the through-hole electrode substrate 300 are explained while referring to FIG. 16. FIGS. 16A and 16B are diagrams which show the sequence of processes for forming a wiring layer (conducting layer) 301 and plurality of gas discharge holes 302 on the silicon substrate 11 in which the insulating layer 13 and through-hole electrode 14 are formed. Furthermore, only one through-hole electrode 14 is shown formed on the silicon substrate 11 in FIGS. 16A and 16B in order to simplify explanation. In an actual silicon substrate 11, a plurality of through-hole electrodes having a desired hole diameter (for example, 10 μm-100 μm) are formed at desired intervals according to specifications. Furthermore, because the processes for forming the insulating layer 13 and through-hole electrode 14 on the silicon substrate 11 are the same as the processes explained in FIG. 3A to 3E in the first embodiment, an explanation of those processes is omitted here.
(1) Forming Process of a Plating Resist Next, in FIG. 16A, a seed layer 311 is formed on the top and bottom surfaces of the silicon substrate 11 on which the wiring layer 301 is formed using a sputtering method. Then, a plating resist 312 is formed above the seed layer 301 using photolithography, the seed layer 311 is made into a power supply layer by electrolyte plating and a conducting layer 313 which becomes the wiring layer 301 is formed. Furthermore, the seed layer 311 may be formed as one layer using a seed material such as titanium Ti or may be formed in two layers using titanium (Ti) and copper (Cu).
(2) Forming Process of a Wiring Layer Next, in FIG. 16B, the plating resist 312 is removed by a chemical process and the seed layer is removed by chemical etching from the top and bottom surface on which the conducting layer 313 of the silicon substrate 11 is formed. Then, a part of the conducting layer 312 is removed, the wiring layer 301 is formed and the forming process of the through-hole electrode substrate 300 is complete.
(Gas Discharge Effect Via the Gas Discharge Hole)

In the through-hole electrode 300 related to the third embodiment, a plurality of the gas discharge holes 302 are formed so that one part of the border section between the insulating layer 13 which is exposed on the surface of the silicon substrate 11, and the through-hole electrode 14, is exposed (so that the through-hole electrode 14 is exposed by an area smaller than the area exposed on the surface of the silicon substrate 11). It is possible for these gas discharge holes 302 to externally discharge gas (water ($H_2O$), hydrogen ($H_2$)) which is discharged from the inside of the through-hole electrode 14. That's is, as is shown in FIG. 7, in the annealing process, the gas (water ($H_2O$), hydrogen ($H_2$)) which is discharged from inside the through-hole electrode 14 is externally discharged from the gas discharge holes 302.

Figure 17:
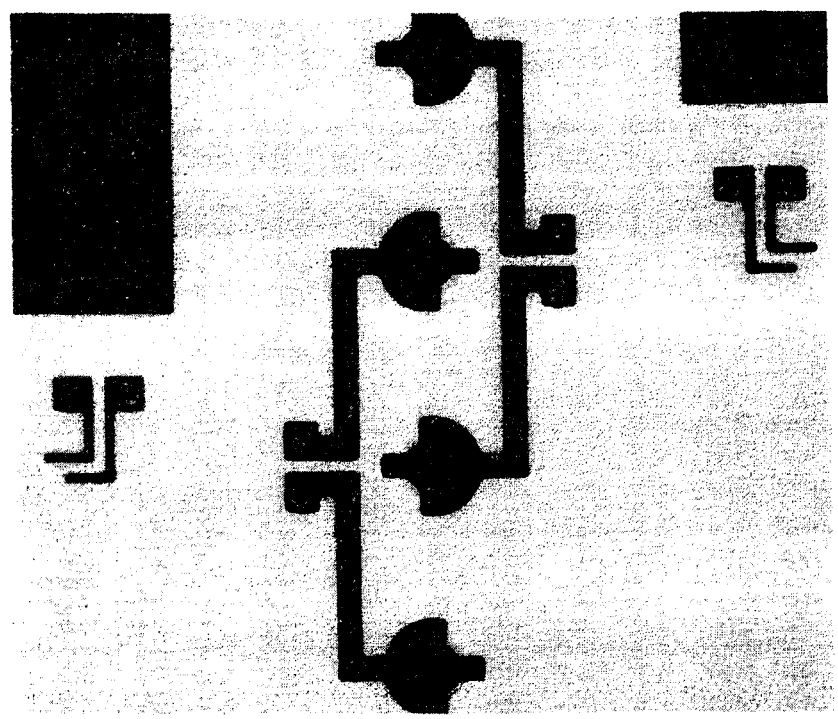
FIG. 17 is a diagram which shows a photograph of the surface of a through-hole electrode substrate which shows an example where peeling or swelling does not occur on the electrode pad and wires.

As a result, it is possible to prevent the occurrence of the blow off and swelling (peeling) phenomenon of the electrode pad as shown in FIG. 21 and FIG. 22. A microscope photograph taken of the substrate surface after forming the gas discharge holes 302 on the through-hole electrode substrate 300 and performing annealing is shown in FIG. 17. As is shown in FIG. 17, peeling or swelling doesn't occur at all on the electrode pad and wire.

As described above, in the through-hole electrode substrate 300 shown in the third embodiment, it is possible to externally discharge the gas discharged from within the through-hole electrode 14 which is formed by filling a metal such as copper (Cu) into the through-hole 12 which is formed in the silicon substrate 11, by arranging these gas discharge holes 302. As a result, it is possible to prevent the occurrence of the blow off, swelling (peeling) of the electrode pad and cracks, reduce the yield at the time of manufacturing the through-hole electrode substrate 300 and improve reliability.

Furthermore, as described above in the first to third embodiments, the case where a resin layer 101 or gas discharge holes 202, 302, are arranged as gas discharge parts on the top and bottom surfaces of the silicon substrate 11, was shown. However, these examples are limited to this structure. Even In the case where a wiring layer 15 is formed on either the top or bottom surface of the silicon substrate 11, by similarly arranging a resin layer 101 or gas discharge holes 202, 302, it is possible to demonstrate the above described gas discharge effects. In addition, in the first to third embodiments described above, as a process for forming the through-hole 12 in the silicon substrate 11, forming the through-hole 12 by forming a hole (a hole with a bottom) on one surface of the silicon substrate 11 and setting back (thinning) the other surface of the silicon substrate 11, was described. The processes however are not limited to this process. For example, the through-hole 12 which passes through the silicon substrate 11 may be formed by polishing and thinning the silicon substrate 11 and etching from one surface.

Fourth Embodiment

The fourth embodiment of the present invention will be explained in detail below while referring to the diagrams.
(Structure of a Through-Hole Electrode Substrate)

Figure 25:
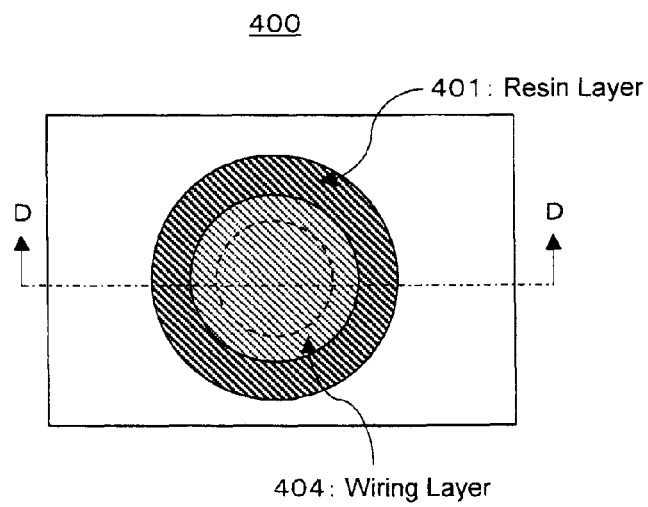
FIG. 25 is planar diagram which shows a structure of a through-hole electrode substrate related to a fourth embodiment of the present invention.
Figure 26:
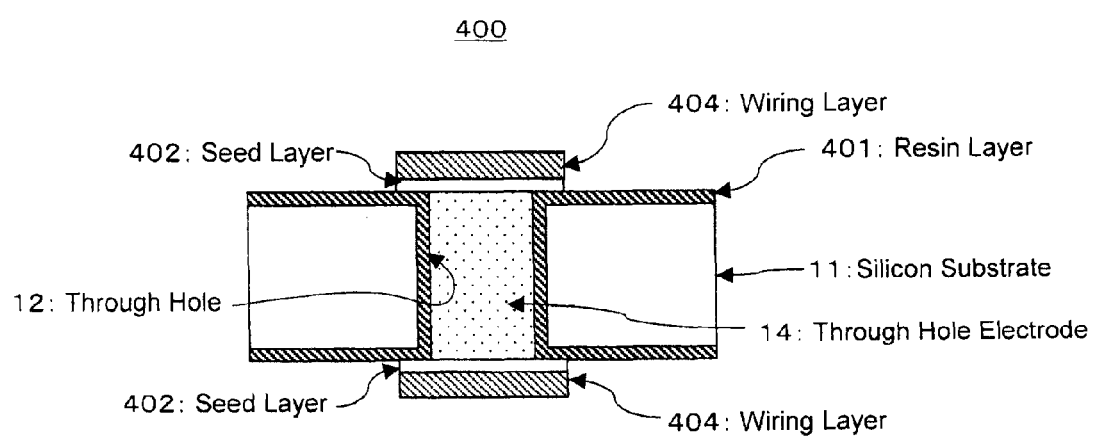
FIG. 26 is cross-sectional diagram which shows the structure of the through-hole electrode substrate of FIG. 25 viewed from the line D-D.

The structure of a through-hole electrode substrate 400 related to the fourth embodiment will be explained in detail while referring to FIG. 25 and FIG. 26. FIG. 25 is a planar diagram of the through-hole electrode substrate 400 viewed from the top surface. FIG. 26 is a cross sectional diagram of FIG. 25 viewed from the line D-D. In FIG. 25 and FIG. 26, the same structural elements as in the through-hole electrode substrate 10 shown in FIG. 18 are attached with the same symbols. In the through-hole electrode substrate 400 shown in FIG. 25 and FIG. 26, a resin layer 401 is formed on the top and bottom surface of the silicon substrate 11 and inner wall of the through-hole 12. The resin layer 401 is from a resin material such polyimide. In other words, an insulating layer having a gas discharge function is sufficient. This resin layer 401 is arranged in order to externally discharge gas which is discharged from the inside of the through-hole electrode 14 described above. That is, in the fourth embodiment, the resin layer 401 is arranged as an insulating layer and a gas discharge part. In addition, the resin layer 401 may be an inorganic insulating layer such as a silicon oxide film or a silicon nitride film. In this case, the insulating layer is used as a cover after the gas is discharged. In this way, a gas discharge state is maintained.

(Manufacturing Method of the Through-Hole Electrode Substrate)

Next, the processes for manufacturing the through-hole electrode substrate 100 will be explained while referring to FIG. 27. FIGS. 27A to 27E are diagrams which show the sequence of processes for forming a through-hole electrode on the silicon substrate 11. Furthermore, FIGS. 27A to 27E only show one through-hole electrode 14 formed on the silicon substrate for the purposes of simplifying explanation. On the actual silicon substrate 11, a plurality of through-hole electrodes with a desired hole diameter (for example, 10 μm to 100 μm) are formed at desired intervals according to specifications.

(1) Forming Process of a Through-Hole

Figure 27A:
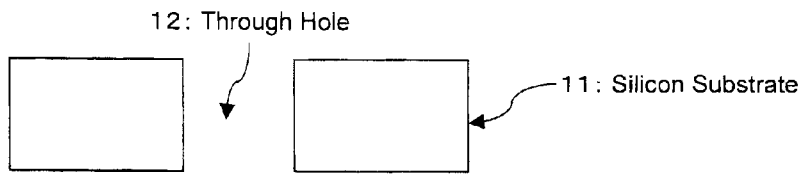
FIG. 27A is a diagram which shows a forming process of a through-hole of a through-hole electrode substrate.

First, in FIG. 27A, the silicon substrate 11 is etched and a hole (not shown in the diagram) which does not pass all the way through, is formed on one surface of the silicon substrate 11 using a method such as RIE, Deep RIE, photo-etching or wet-etching. Next, on the other surface of the silicon substrate 11, that is, the surface opposite to the one where the hole is formed, the silicon substrate 11 is set back (thinned) using a method such as grinding and the through-hole 12 passes completely through the substrate. Furthermore, the formation method of the through-hole 12 is not limited to this formation method. For example, the through-hole may be formed by using RIE, Deep RIE, photo-etching or wet-etching from one surface of the silicon substrate 11.

(2) Forming Process of a Resin Layer

Figure 27B:
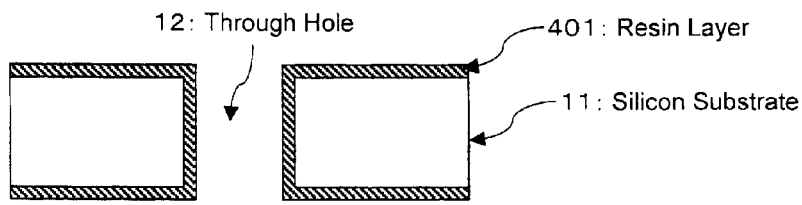
FIG. 27B is a diagram which shows a forming process of a resin layer of a through-hole electrode substrate.

Next, in FIG. 27B, the resin layer 401 is formed as an insulation layer on the top and bottom surface of the silicon substrate 11 and inner wall of the through-hole 12. This resin layer 401 is formed using a spray coat method for example. The resin layer 401 can be formed from one or two or more of the following: epoxy resin, polyimide resin, benzocyclobutene resin, polyimide, phenol resin, silicon resin, fluorine resin, crystal polymer, polyamide-imide, polybenzoxazole, isocyanate resin, aramid, polyolefin, polyester, BT resin, polyacetal, polybutylene terephthalate, syndiotactic polystyrene, polyphenylene sulfide, polyether ether ketone, polyether nitrile, polycarbonate, polyphenylene ether polysulfone, polyethersulfone, polyarylate or polyetherimide. In addition, the resin layer 401 may be combined with an inorganic filler such as glass, talc, mica, silica or alumina.

In addition, in the case of forming the above described through-hole 12 by Deep RIE, it is known that a scallop can occur in the inner walls of the through-hole 12. In the fourth embodiment, it is possible to flatten the inner walls of the through-hole 12 and cover the scallop without any gaps by forming the resin layer 401 in the inner walls of the through-hole 12.

(3) Forming Process of a Seed Layer

Figure 27C:
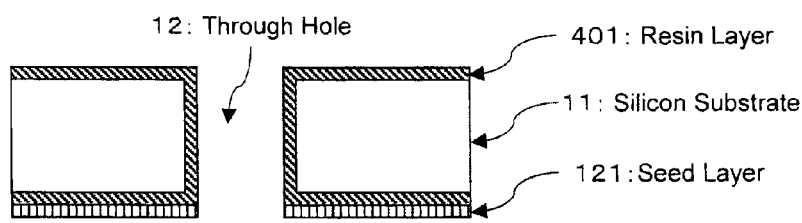
FIG. 27C is a diagram which shows a forming process of a seed layer of a through-hole electrode substrate.

Next, in FIG. 27C, a seed layer 121 is formed on the bottom surface of the silicon substrate 11 on which the resin layer 401 is formed, using such as a sputtering method. Furthermore, the seed layer 121 may be formed as one layer using titanium (Ti) or as two layers using titanium (Ti) and copper (Cu). In the case of forming the seed layer 121 as two layers, it is preferred that the copper layer (Cu) be formed as a layer which contacts with the through-hole electrode 14.

(4) Forming Process of a Conducting Part

Figure 27D:
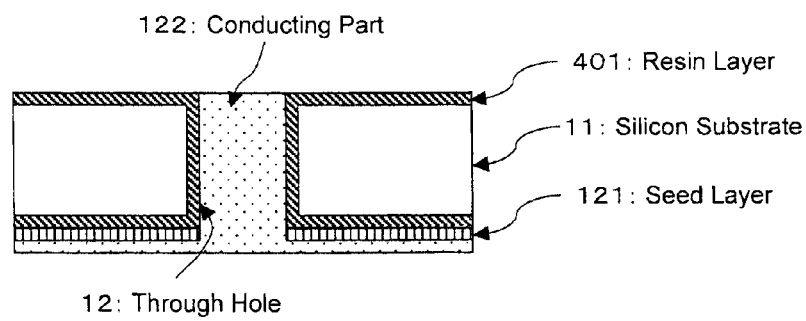
FIG. 27D is a diagram which shows a forming process of a conducting part of a through-hole electrode substrate.
Figure 27E:
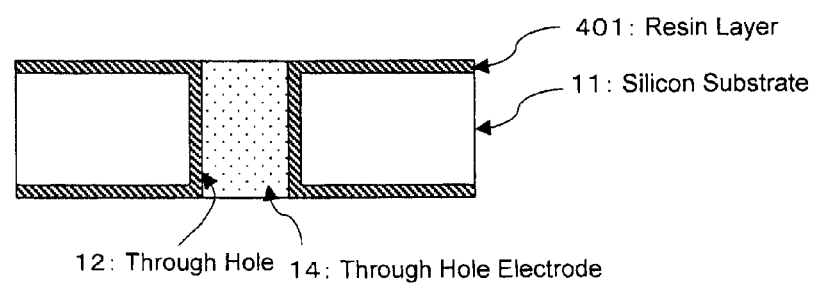
FIG. 27E is a cross-sectional diagram of a completed through-hole electrode of a through-hole electrode substrate.

Next, in FIG. 27D, a conducting material (such as copper (Cu) or a copper alloy) is filled into the through-hole 12 by electroplating, the seed layer 121 of the silicon substrate 11 becomes a power supply layer and a conducting part 122 is formed. In this case, as is shown in FIG. 27D, the conducting part 122 is also formed on the surface on which the seed layer 121 is formed. A sputtering method, nonelectrolytic plating method, molten metal suction method, print method or CVD method can be used to fill the copper (Cu) or copper alloy.

(5) Forming Process of a Through-Hole Electrode

Next, in FIG. 28E, the surface on which the seed layer 121 and the conducting part 122 are formed of the silicon substrate 11 is etched using such as a CMP method, the unnecessary conducting part 122 and one part of the seed layer 121 are removed and the forming process of the through-hole electrode 14 is complete.

(6) Forming Process of a Plating Resist

Figure 28A:
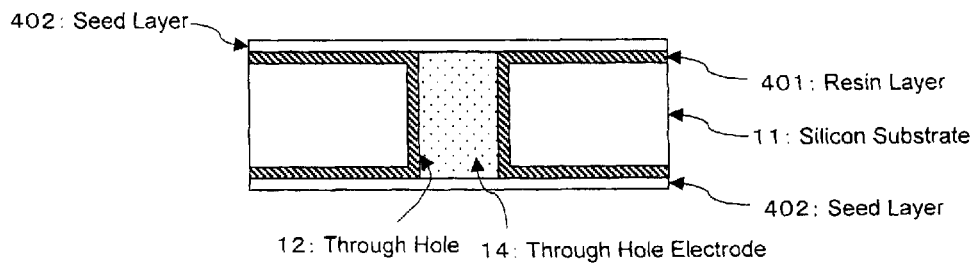
FIG. 28A is a diagram which shows a forming process of a seed layer of a through-hole electrode substrate.
Figure 28B:
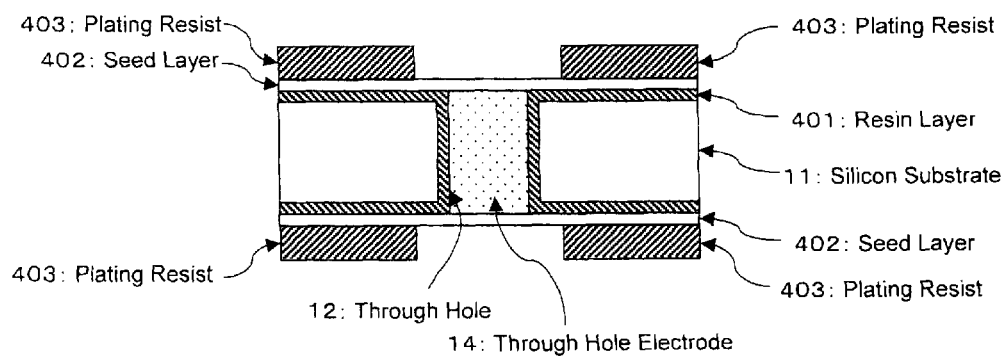
FIG. 28B is a diagram which shows a forming process of a plating resist of a through-hole electrode substrate.

Next, in FIG. 28A, a seed layer 402 is formed on the surface on which the resin layer 401 is formed using a sputtering method. Next, in FIG. 28B, a plating resist 403 is formed above the seed layer 402 using photolithography. Furthermore, the seed layer 402 may be formed as one layer using a seed material such as titanium (Ti) or may be formed in two layers using titanium (Ti) and copper (Cu).

(7) Forming Process of a Wiring Layer

Figure 28C:
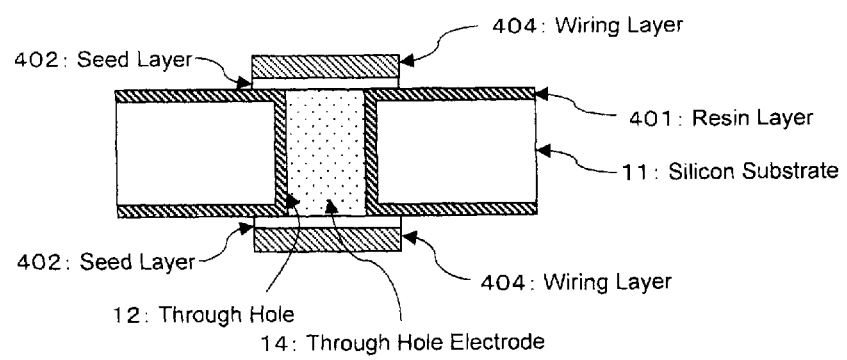
FIG. 28C is cross-sectional diagram of a completed through-hole electrode substrate.

Next, in FIG. 28C, a wiring layer 404 which becomes the wires and electrode pads is formed as a power supply layer by the seed layer 402 by electrolyte plating. The wiring layer 404 may be formed using such as copper (Cu), gold (Au), multilayer plating (Cu, Ni, Au) or a copper alloy. Next, the plating resist 404 is removed by a chemical process and the seed layer 402 is removed by chemical etching from the surface on which the wiring layer 404 of the silicon substrate 11 is formed. Then the forming process of the through-hole electrode substrate 400 is complete.

In FIG. 27 and FIG. 28, the case where the resin layer 401 and the wiring layer 404 is formed on the top and bottom surfaces of the silicon substrate 11 was shown, however, the resin layer 401 and the wiring layer 404 may be similarly formed on either the top or the bottom surface of the silicon substrate 11 by the above described process.

(Gas Discharge Effects by a Resin Layer)

Figure 29:
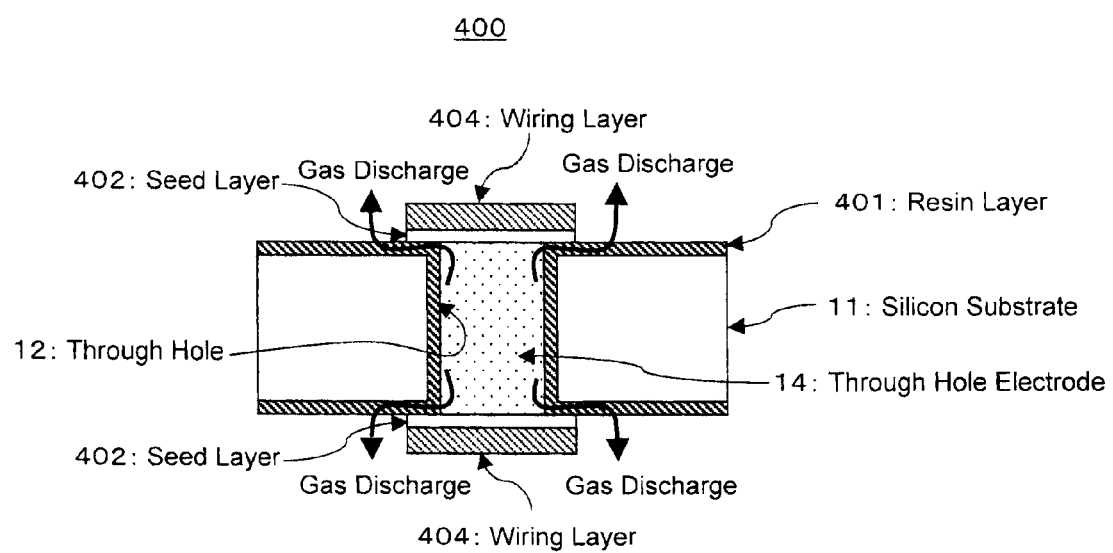
FIG. 29 is an exemplary diagram which shows a gas discharge from a resin layer of the through-hole electrode substrate related to the fourth embodiment.

In the through-hole electrode substrate 400 related to the fourth embodiment, the resin layer 401 is formed on the top and bottom surfaces of the silicon substrate 11 and the inner walls of the through-hole 12. In addition, in the resin layer 401 because the molecular structure from the molecules of the gas (water ($H_2O$), hydrogen ($H_2$)) which is discharged from inside of the through-hole electrode 14 is large it is possible to externally discharge this gas. That is, as is shown in FIG. 29, in the annealing process, the gas (water ($H_2O$), hydrogen ($H_2$)) which is discharged from within the through-hole electrode 14 is externally discharged via the resin layer 401. As a result, it is possible to prevent the occurrence of the blow off and swelling (peeling) phenomenon of the electrode pad as shown in FIG. 21 and FIG. 22.

As a result of this, in the through-hole electrode substrate 400 described above, in the case where the resin layer 401 is formed on the top and bottom surfaces of the silicon substrate 11 and the inner walls of the through-hole 12, in addition to the effect of externally discharging gas from the inside of the through-hole electrode 14, it was identified that stretching of copper (Cu) which is filled as the through-hole electrode 14 was reduced (elasticity effect).

As described above, in the through-hole electrode substrate 400 shown in the fourth embodiment, the gas which is discharged from the inside of the through-hole electrode 14 in which a metal material such as copper (Cu) is filled into the through-hole 12 which is formed in the silicon substrate 11 can be externally discharged via the resin layer 401. In addition, it was identified that this resin layer 401 had an effect (elasticity effect) of reducing stretching of the copper (Cu) which is filled. As a result, it is possible to prevent the occurrence of the blow off, swelling (peeling) of the electrode pad and cracks, reduce the yield at the time of manufacturing the through-hole electrode substrate 400 and improve reliability.

Furthermore, in the through-hole electrode substrate 400 shown in the fourth embodiment, the resin layer 401 is formed as an insulating film on the top and bottom surfaces of the silicon substrate 11 and on the inner wall of the through-hole 12. Consequently, when forming the through-hole 12 using a Deep RIE method, it is possible to flatten the inner walls of the through-hole 12 by filling scallop gaps that occur in the inner walls of the through-hole 12 and it becomes possible to favorably fill a conducting material (copper (Cu) or a copper alloy) into the through-hole 12 using a plating method.

In addition, in the through-hole electrode substrate 400 shown in the fourth embodiment, because the resin layer 401 is arranged as an insulating layer and a gas discharge part, the number of processes in its forming can be reduced compared to the process for forming the insulating layer 13 and resin layer 101 in the through-hole electrode substrate 100 shown in the first embodiment. An example of each forming process of the insulating layer 13, the resin layer 101 and the resin layer 401 are compared in FIG. 30.

Figure 30A:
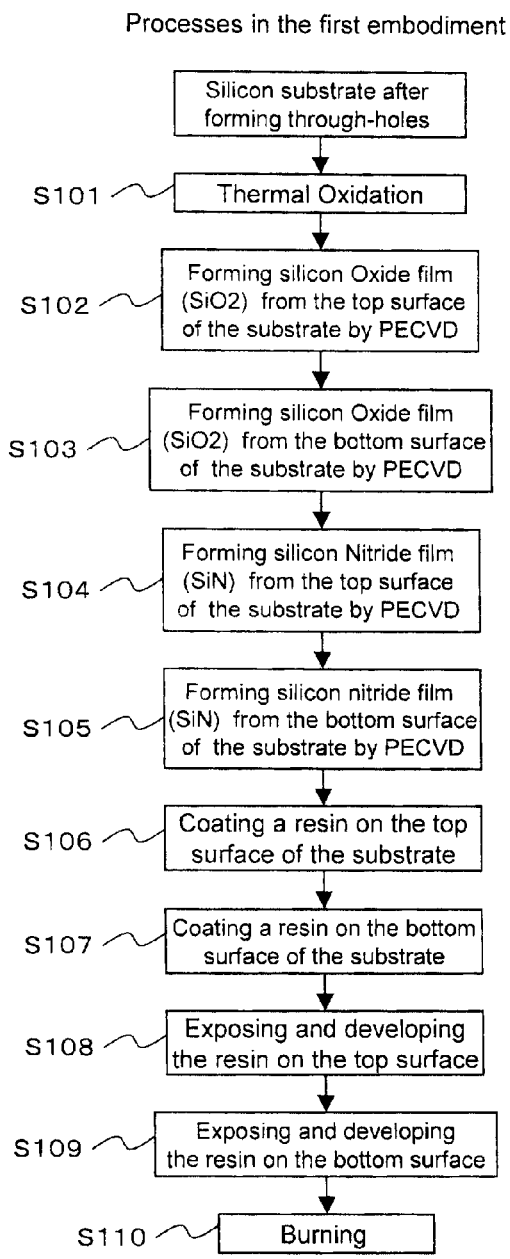
FIG. 30A is a diagram which shows an example of a forming process of an insulating layer and a resin layer of the through-hole electrode substrate related to the fourth embodiment.
Figure 30B:
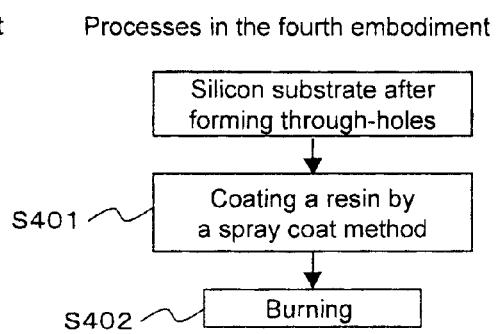
FIG. 30B is a diagram which shows an example of a forming process of a resin layer of the through-hole electrode substrate related to the fourth embodiment.

In FIG. 30, 30A shows an example of a forming process of the insulating layer 13 and the resin layer 101 by the first embodiment, and 30B shows an example of the forming process of the resin layer 401 by the fourth embodiment. In this case, it is possible to reduce the processes related to PECVD (Plasma Enhanced Chemical Vapor Deposition) in the forming process of the resin layer 401 by the fourth embodiment compared to the forming process of the insulating layer 13 and the resin layer 101 by the first embodiment. In particular, in the forming process of the through-hole electrode using the PECVD process it is necessary to form a thick insulating layer 13 in order to secure insulating properties which results in an increase in manufacturing costs. Therefore, in the through-hole electrode substrate 400 shown in the fourth embodiment, it is possible to reduce manufacturing costs compared to the through-hole electrode substrate 100 shown in the first embodiment due to a reduction in PECVD processes.

Furthermore, in the through-hole electrode substrate 400 shown in the fourth embodiment, because the resin layer 401 is formed as an insulation layer on the top and bottom surfaces of the silicon substrate 11 and on the inner walls of the through-hole 12, it is no longer necessary to form the resin layer 101 and gas discharge holes 202, 302 so as to match the exposed opening position of the through electrode 14, the same as resin layer 101 and gas discharge holes 202, 302 formed in the through-hole electrode substrates 100 to 300 shown in the first to third embodiments described above. As a result, it is possible to form the resin layer 401 even when the diameter of the through-hole electrode 14 is small. In addition, in the through-hole electrode substrate 400 shown in the fourth embodiment, it is possible to easily form the resin layer 401 without consideration for resolution limits of the resin layer 401 and deviations from the opening position of the through-hole electrode 14.

Fifth Embodiment

In the fifth embodiment, an example of an electronic circuit board which uses the through-hole electrode substrates 100 to 400 shown in the first to fourth embodiments described above as an interposer 504, is explained.

Figure 31:
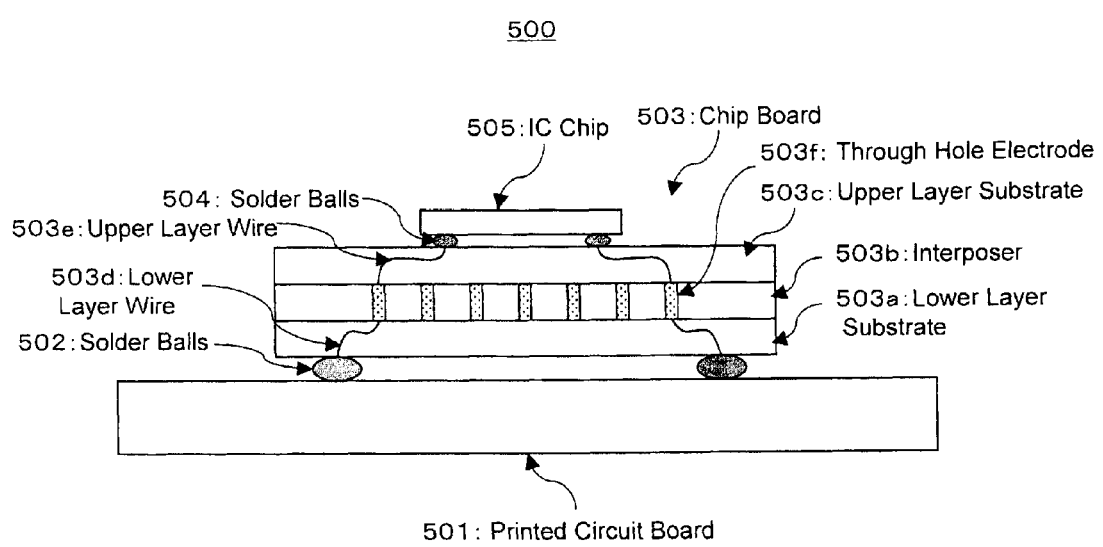
FIG. 31 is a diagram which shows the structure of an electronic circuit board which is applied with a through-hole electrode substrate related to a fifth embodiment.

FIG. 31 is a diagram which shows the structure of an electronic circuit board 500 which uses the through-hole electrode substrates 100 to 400 shown in the first to fourth embodiments described above as an interposer 504. In FIG. 51, an electronic circuit board 500 is arranged with a printed circuit board 501 and a chip board 503 comprised of a lower layer substrate 503a, an interposer 503b and an upper layer substrate 503c. A plurality of solder balls 502 are formed on the top surface of the printed circuit board 501, and he printed circuit board 501 and the chip board 503 are electrically connected via the plurality of solder balls 502. A plurality of solder balls 504 are formed on the top surface of the chip board 503 and the chop board 503 and an IC chip 505 are electrically connected via the plurality of solder balls 504.

A lower layer wire 503d is formed in the lower layer substrate 503a so that the solder balls 502 and the through-hole electrode 503f of the interposer 503b are electrically connected. The lower layer wire 503d is formed to match the forming position of the solder balls 502 and the forming position of the through-hole electrode 503f of the interposer 503b. An upper layer wire 503e is formed in the upper layer substrate 503c so that the through-hole electrode of the interposer 503b and the solder balls 504 are electrically connected. The upper layer wire 503e is formed to match the forming position of the through-hole electrode 503f of the interposer 503b, and the forming position of the solder balls 504.

The interposer 503b is electrically connected with the lower layer wire 503d which is formed on the lower layer substrate 503a via a plurality of through-hole electrodes 503f, and the upper layer wire 503e formed on the upper layer substrate 503c. As is shown in FIG. 30, by applying the interposer 503b within the chip board 503 there is no need to change the wiring pattern (not shown in the diagram) of the printed circuit board 501, and it is possible to mount the chip 505 at a high density via the chip board 503.

As described above, it is possible to mount the IC chips 505 at a high density on the printed circuit board 501 by structuring the electronic circuit board 500 using the through-hole electrode substrates 100 to 400 as interposers 504. Therefore, it is possible to contribute to the miniaturization of electronic devices by applying this type of electronic circuit board 500 in an electronic device.

Furthermore, an example which applied the through-hole electrode substrates 100 to 400 as interposers 504 of the electronic circuit board 500 was shown in the fifth embodiment, however, it is not limited to this. For example, the through-hole electrode substrate can also be applied to various devices where mounting at high density is desired such as a mobile phones, computers, and IC test probe cards.

What is claimed is:

1. A manufacturing method of a through-hole electrode substrate comprising:
 forming a plurality of through-holes which pass through a semiconductor substrate in the thickness direction of a semiconductor substrate;
 forming an insulating layer with an insulating material on the inner walls of the plurality of through-holes and on at least one surface of the semiconductor substrate;
 forming a plurality of through-hole electrodes with a metal material inside the plurality of through-holes; and
 forming a plurality of gas discharge parts which externally discharge gas which is discharged from the inside of the plurality of through-hole electrodes, the plurality of gas discharge parts contacting with each of the plurality of through-hole electrodes which is exposed on at least one surface of the semiconductor substrate.

2. A manufacturing method of a through-hole electrode substrate comprising:
 forming a plurality of holes which have an opening on one surface of a semiconductor substrate;
 forming a plurality of through-holes by thinning from the other surface on which the plurality of holes of the semiconductor substrate is not formed, and making the plurality of holes pass through the semiconductor substrate;
 forming an insulating layer with an insulating material on the inner walls of the plurality of through-holes and on at least one surface of the semiconductor substrate;
 forming a plurality of through-hole electrodes with a metal material inside the plurality of through-holes; and
 forming a plurality of gas discharge parts which externally discharge gas which is discharged from the inside of the plurality of through-hole electrodes, the plurality of gas discharge parts contacting with each of the plurality of through-hole electrodes which is exposed on at least one surface of the semiconductor substrate.

3. The manufacturing method of a through-hole electrode substrate according to claim 1, wherein each of the plurality of gas discharge parts is formed to cover one part of a border section between a formed part of the insulating layer and a formed part of each of the plurality of through-hole electrodes, and formed to cover an area smaller than an area of each of the plurality of through-hole electrodes which is exposed on a surface of the semiconductor substrate.

4. The manufacturing method of a through-hole electrode substrate according to claim 1, wherein the plurality of gas discharge parts is formed from an insulating material.

5. The manufacturing method of a through-hole electrode substrate according to claim 1, wherein the plurality of gas discharge parts is formed from a insulating resin.

6. The manufacturing method of a through-hole electrode substrate according to claim 1, further comprising:
 forming a plurality of electrode pads which is electrically connected to the plurality of through-hole electrodes, on a surface of the semiconductor substrate according to each formed position of the plurality of through-hole electrodes;
 wherein
 each of the plurality of gas discharge parts passes through one part of each of the plurality of electrode pads and is formed as a hole which exposes a border section between the insulating layer and each of the plurality of through-hole electrodes.

7. The manufacturing method of a through-hole electrode substrate according to claim 1, further comprising:
 forming a plurality of wiring layers which is electrically connected to the plurality of through-hole electrodes on a surface of the semiconductor substrate on which the plurality of through-hole electrodes is exposed;
 wherein
 each of the plurality of gas discharge parts the passes through one part of the plurality of wiring layers and is formed as a hole which exposes a border section between the insulating layer and each of the plurality of through-hole electrodes.

8. A manufacturing method of a through-hole electrode substrate comprising:
 forming a plurality of through-holes which pass through in the thickness direction of a semiconductor substrate;
 forming a resin layer with insulating resin on the inner walls of the plurality of through-holes and on at least one surface of the semiconductor substrate; and
 forming a plurality of through-hole electrodes with a metal material inside the plurality of through-holes.

9. The manufacturing method of a through-hole electrode substrate according to claim 8, wherein the resin layer is formed by coating the insulating resin using a spray coat method.

10. The manufacturing method of a through-hole electrode substrate according to claim 8, further comprising:
 forming a plurality of wiring layers which is electrically connected with the plurality of through-hole electrodes, on a surface of the semiconductor substrate on which the plurality of through-hole electrodes is exposed.

* * * * *